(12) United States Patent
Shim et al.

(10) Patent No.: US 10,061,647 B2
(45) Date of Patent: Aug. 28, 2018

(54) NONVOLATILE MEMORY DEVICES, METHODS OF OPERATING THE SAME AND SOLID STATE DRIVES INCLUDING THE SAME

(71) Applicant: Samsung Electronics Co., Ltd., Suwon-Si, Gyeonggi-do (KR)

(72) Inventors: Young-Seop Shim, Seoul (KR); Jae-Hong Kim, Seoul (KR); Sang-Soo Cha, Suwon-si (KR); Jin-Man Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/237,111

(22) Filed: Aug. 15, 2016

(65) Prior Publication Data

US 2017/0062065 A1    Mar. 2, 2017

(30) Foreign Application Priority Data

Aug. 25, 2015 (KR) .................. 10-2015-0119697

(51) Int. Cl.
| | | |
|---|---|---|
| *G11C 29/00* | (2006.01) | |
| *G06F 11/10* | (2006.01) | |
| *G11C 29/52* | (2006.01) | |
| *G11C 16/10* | (2006.01) | |
| *G11C 16/34* | (2006.01) | |
| *G11C 16/20* | (2006.01) | |
| *G11C 16/26* | (2006.01) | |
| *G11C 29/02* | (2006.01) | |
| G11C 29/04 | (2006.01) | |
| G11C 29/50 | (2006.01) | |

(52) U.S. Cl.
CPC ...... *G06F 11/1068* (2013.01); *G06F 11/1048* (2013.01); *G11C 16/10* (2013.01); *G11C 16/20* (2013.01); *G11C 16/26* (2013.01); *G11C 16/349* (2013.01); *G11C 16/3495* (2013.01); *G11C 29/025* (2013.01); *G11C 29/028* (2013.01); *G11C 29/52* (2013.01); *G11C 2029/0407* (2013.01); *G11C 2029/0409* (2013.01); *G11C 2029/0411* (2013.01); *G11C 2029/5004* (2013.01)

(58) Field of Classification Search
CPC .. G06F 11/1068; G06F 11/1048; G11C 29/52; G11C 29/025; G11C 29/028; G11C 16/10; G11C 16/349; G11C 16/20; G11C 16/26; G11C 16/3495
See application file for complete search history.

(56) References Cited

U.S. PATENT DOCUMENTS

| | | |
|---|---|---|
| 7,797,480 B2 | 9/2010 | Mokhlesi et al. |
| 8,385,118 B2 | 2/2013 | Yip |
| 8,416,624 B2 | 4/2013 | Lei et al. |
| 8,644,075 B2 | 2/2014 | Hemink et al. |
| 8,873,300 B2 | 10/2014 | Kim |
| 8,966,350 B2 | 2/2015 | Mokhlesi et al. |

(Continued)

*Primary Examiner* — Sam Rizk
(74) *Attorney, Agent, or Firm* — Ward and Smith, P.A.

(57) ABSTRACT

In a method of operating a nonvolatile memory device, a plurality of pages of a first memory block of a plurality of memory blocks of a memory cell array are programmed. After programming, a dummy pulse is applied to at least some of the plurality of memory blocks at least once before a read operation on is performed on one of the plurality of pages.

20 Claims, 21 Drawing Sheets

(56) References Cited

U.S. PATENT DOCUMENTS

| | | |
|---|---|---|
| 8,988,937 B2 | 3/2015 | Dunga et al. |
| 8,988,939 B2 | 3/2015 | Dunga et al. |
| 2005/0105359 A1* | 5/2005 | Matsunaga ................. 365/222 |
| 2008/0130363 A1* | 6/2008 | Hosono ............. G11C 16/3418 365/185.2 |
| 2010/0008145 A1* | 1/2010 | Wang ................... G11C 16/10 365/185.19 |
| 2010/0246270 A1* | 9/2010 | Moschiano ......... G11C 11/5628 365/185.19 |
| 2014/0233316 A1 | 8/2014 | Shim et al. |
| 2014/0241064 A1 | 8/2014 | Lee et al. |
| 2014/0241069 A1 | 8/2014 | Kwak et al. |
| 2015/0009760 A1 | 1/2015 | Nam et al. |
| 2015/0063037 A1 | 3/2015 | Lee et al. |

* cited by examiner

| P/E CYCLE | MTT |
|---|---|
| 50 | 20h |
| 100 | 10h |
| 200 | 5h |
| ⋮ | ⋮ |

630  631 / 633

| P/E CYCLE | RCT |
|---|---|
| 50 | 5 |
| 100 | 10 |
| 200 | 15 |
| ⋮ | ⋮ |

650  651 / 653

NONVOLATILE MEMORY DEVICES, METHODS OF OPERATING THE SAME AND SOLID STATE DRIVES INCLUDING THE SAME

CROSS-REFERENCE TO RELATED APPLICATION

This U.S. Non-provisional application claims priority under 35 USC § 119 to Korean Patent Application No. 10-2015-0119697, filed on Aug. 25, 2015, in the Korean Intellectual Property Office (KIPO), the disclosure of which is incorporated by reference in its entirety herein.

BACKGROUND

1. Technical Field

The inventive concepts relate generally to semiconductor memory devices, and more particularly to nonvolatile memory devices, methods of operating nonvolatile memory devices and solid state drives including the same.

2. Discussion of the Related Art

Semiconductor memory devices may be classified as volatile semiconductor memory devices or nonvolatile semiconductor memory devices. Volatile semiconductor memory devices may perform read and write operations at high speed, while contents stored therein may be lost when the devices are powered-off. Nonvolatile semiconductor memory devices may retain contents stored therein even when powered-off. For this reason, nonvolatile semiconductor memory devices may be used to store contents that need to be retained regardless of whether the devices are powered on or off.

Nonvolatile semiconductor memory devices may include devices, such as mask read-only memories (MROMs), programmable ROMs (PROMs), erasable programmable ROMs (EPROMs), electrically erasable programmable ROMs (EEPROMs), etc.

A flash memory device is a type of nonvolatile memory device. Flash memory devices are widely used to store media on electronic apparatuses such as computers, cellular phones, PDAs, digital cameras, camcorders, voice recorders, MP3 players, handheld PCs, game machines, facsimiles, scanners, printers, etc.

As the demands for increased storage capability have increase, manufacturers of memory devices have sought to increase the integration level of semiconductor memories. To that end, multi-bit memory devices that store multiple bits of data in each memory cell have been developed.

SUMMARY

According to example embodiments, in a method of operating a nonvolatile memory device, a plurality of pages of a first memory block of a plurality of memory blocks of a memory cell array are programmed. After programming, a periodic dummy pulse is applied to at least some of the plurality of memory blocks. A read operation is performed on a first one of the plurality of pages after the dummy pulse has been applied. The plurality of memory blocks may be formed vertically with respect to a substrate.

In example embodiments, a read operation may be further performed on at least one of the pages of the first memory block.

The dummy pulse may be applied to all of the plurality of memory blocks at least once when error bits in a read data occur consecutively at least a reference number of times after the read operation is performed.

In example embodiments, the dummy pulse may be applied to pages of the first memory block other than the first page.

The dummy pulse may be applied simultaneously to at least two pages of the other pages.

The dummy pulse may be applied sequentially to at least two pages of the other pages.

In example embodiments, the dummy pulse may be applied to at least one page of the pages of the first memory block that is randomly selected.

In example embodiments, the dummy pulse may be applied to all of the plurality of memory blocks when the nonvolatile memory device is powered-up.

In example embodiments, the dummy pulse may be applied simultaneously to at least two memory blocks of the plurality of memory blocks.

In example embodiments, the dummy pulse may be applied to at least two memory blocks of the plurality of memory blocks when the nonvolatile memory device wakes up from a power-down mode.

In example embodiments, the dummy pulse may be applied to the at least some of the memory blocks based on a number of a program/erase cycles of the first memory block.

Applying the dummy pulse may include applying the dummy pulse to word-lines of the selected ones of the plurality of memory blocks without concurrently performing a read or write operation on the selected ones of the plurality of memory blocks An application interval of the dummy pulse may decrease as the number of the program/erase cycle of the first memory block increases.

In example embodiments, the dummy pulse may be applied to the memory blocks based on at least one of an elapsed time from a completion of the program loop and an operating temperature of the nonvolatile memory device.

In example embodiments, the dummy pulse may correspond to one of a read pass voltage and a read voltage which are applied to word-lines of the nonvolatile memory device.

According to example embodiments, a nonvolatile memory device includes a memory cell array, a voltage generator, an address decoder and a control circuit. The memory cell array includes a plurality of memory blocks. The voltage generator generates word-line voltages based on control signals. The address decoder provides the word-line voltages to the memory cell array based on an address signal. The control circuit controls the voltage generator. The control circuit sequentially performs a program loop on a plurality of pages of a first memory block of the plurality of memory blocks. The control circuit includes a dummy pulse controller that causes the voltage generator to apply a dummy pulse to at least some of the plurality of memory blocks at least once before a read operation is performed on a first page that is selected among the plurality of pages.

In example embodiments, the dummy pulse may correspond to one of a read pass voltage and a read voltage of the word-line voltages which are applied to word-lines of the nonvolatile memory device. The dummy pulse controller causes the voltage generator to apply the periodic dummy pulse simultaneously to at least two memory blocks of the plurality of memory blocks.

In example embodiments, the dummy pulse controller may cause the voltage generator to apply the dummy pulse to at least some of the memory blocks based on at least one of a number of a program/erase cycle of the first memory block, an elapsed time from a completion of the program loop and an operating temperature of the nonvolatile memory device.

In example embodiments, the dummy pulse controller may include a first table, a second table and a dummy pulse control signal generator. The first table may store a number of a program/erase cycles of at least one of the plurality of memory blocks and a maximum threshold value of an elapsed time from a completion of the program loop associated with the program/erase cycles. The second table may store the number of the program/erase cycles and a maximum threshold value of a number of a read retry associated with the program/erase cycle. The dummy pulse control signal generator may generate a dummy control signal that causes the voltage generator to apply the dummy pulse in response to at least one of a first counting value, a second counting value, a time information, a temperature signal, a mode signal and a power-up signal. The first counting value may indicate the number of the program/erase cycles, the second counting value may indicate the number of the read retries, the time information may indicate the elapsed time from the completion of the program loop, the temperature signal may indicate an operating temperature of the nonvolatile memory device, and the mode signal may indicate an operation mode of the nonvolatile memory device.

According to example embodiments, a solid-state drive (SSD) includes a plurality of nonvolatile memory devices and an SSD controller. The SSD controller controls the plurality of nonvolatile memory devices. Each of the plurality of nonvolatile memory devices includes a memory cell array, a voltage generator, an address decoder and a control circuit. The memory cell array includes a plurality of memory blocks that are formed vertically with respect to a substrate. The voltage generator generates word-line voltages based on control signals. The address decoder provides the word-line voltages to the memory cell array based on an address signal. The control circuit controls the voltage generator. The control circuit sequentially performs a program loop on a plurality of pages of a first memory block of the plurality of memory blocks. The control circuit includes a dummy pulse controller that causes the voltage generator to apply a periodic dummy pulse to at least some of the plurality of memory blocks at least once before a read operation is performed on a first page that is selected among the plurality of pages.

In example embodiments, the SSD controller may perform an error correction code (ECC) decoding on a read data from each of the plurality of nonvolatile memory devices and may provide each of the plurality of nonvolatile memory devices with corresponding pass/fail information of the read data. The dummy pulse controller may cause the voltage generator to apply the periodic dummy pulse to all of the memory blocks at least once in response to the pass/fail information indicating that error bits in the read data occur consecutively at least a reference number of times.

According to a method of operating a nonvolatile memory device, the increase of a number of error bits in a read operation may be prevented or reduced by applying a dummy pulse to at least some of memory blocks at least once before performing a read operation after completion of a program loop.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
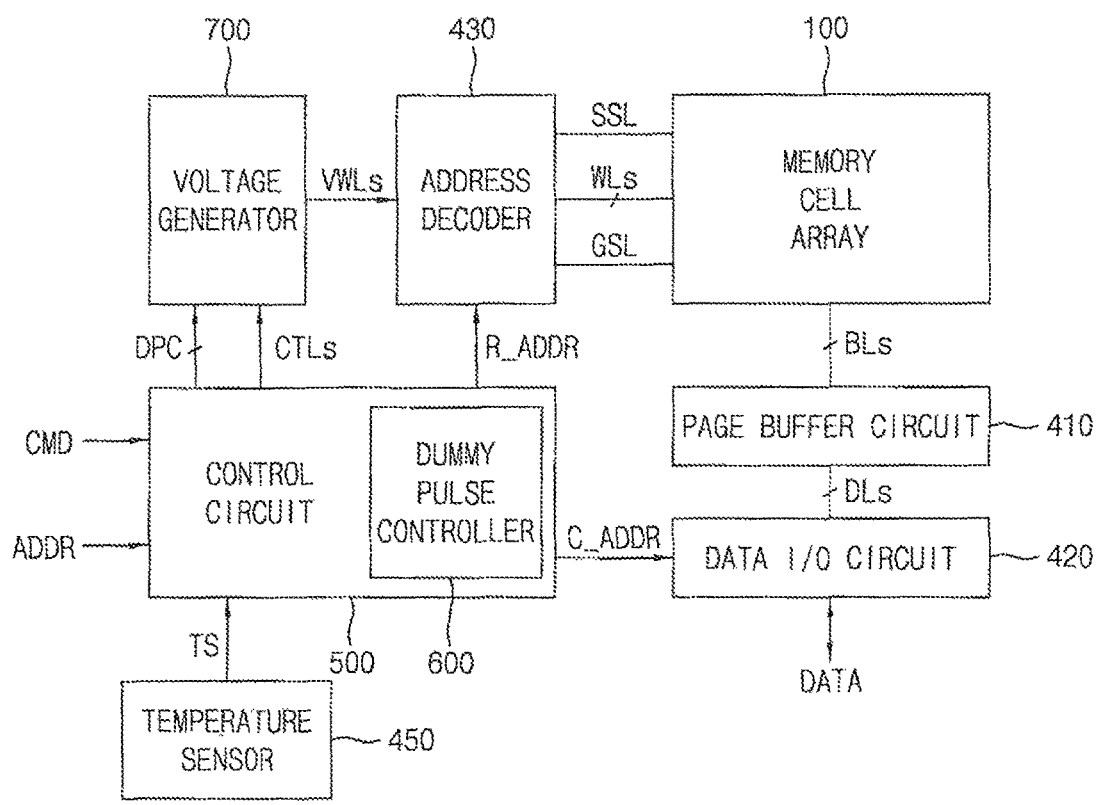
FIG. 1 is a block diagram illustrating a nonvolatile memory device according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

FIG. 1 is a block diagram illustrating a nonvolatile memory device according to example embodiments.

Referring to FIG. 1, a nonvolatile memory device 10 includes a memory cell array 100, an address decoder 430, a page buffer circuit 410, a data input/output circuit 420, a control circuit 500 and a voltage generator 700. The nonvolatile memory device 10 may further include a temperature sensor 450. The temperature sensor 450 may provide the control circuit 500 with a temperature signal TS that indicates an operating temperature of the nonvolatile memory device 10. The temperature signal TS may be used by the control circuit 500 to determine when to apply a dummy pulse to the memory cell array 100, as will be described in more detail below.

The memory cell array 100 may be coupled to the address decoder 430 through a string selection line SSL, a plurality of word-lines WLs, and a ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

In some embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other example embodiments, the memory cell array 100 may be a two-dimensional memory cell array, which is formed on a substrate in a two-dimensional structure (or a horizontal structure).

Figure 2:
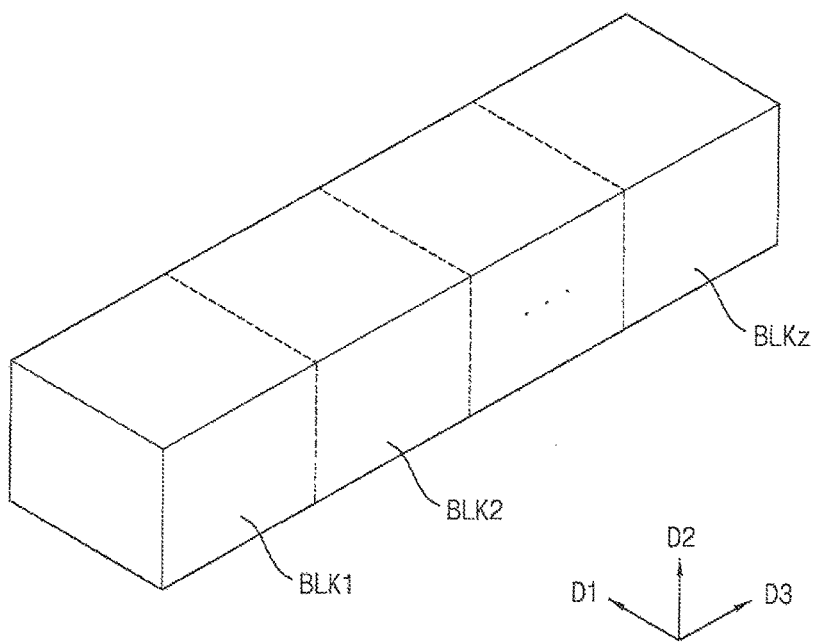
FIG. 2 is a block diagram illustrating the memory cell array in FIG. 1.

FIG. 2 is a block diagram illustrating the memory cell array in FIG. 1 in accordance with some embodiments.

Referring to FIG. 2, the memory cell array 110a may include a plurality of memory blocks BLK1 to BLKz, which may be selected by the address decoder 430 in FIG. 1. For example, the address decoder 430 may select a memory block BLK corresponding to a block address among the memory blocks BLK1 to BLKz.

Figure 3:
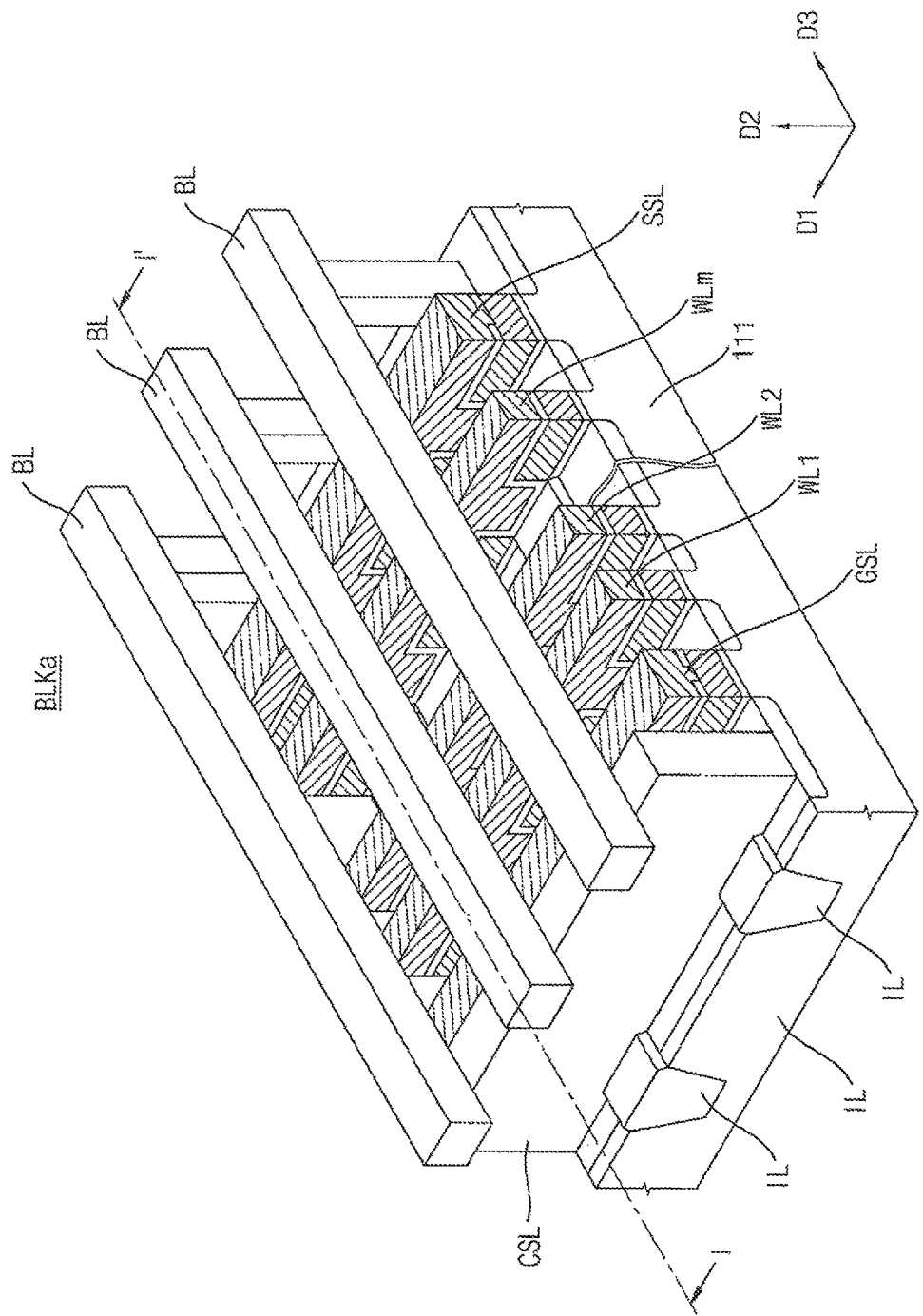
FIG. 3 is a perspective view illustrating one of the memory blocks of FIG. 2.
Figure 4:
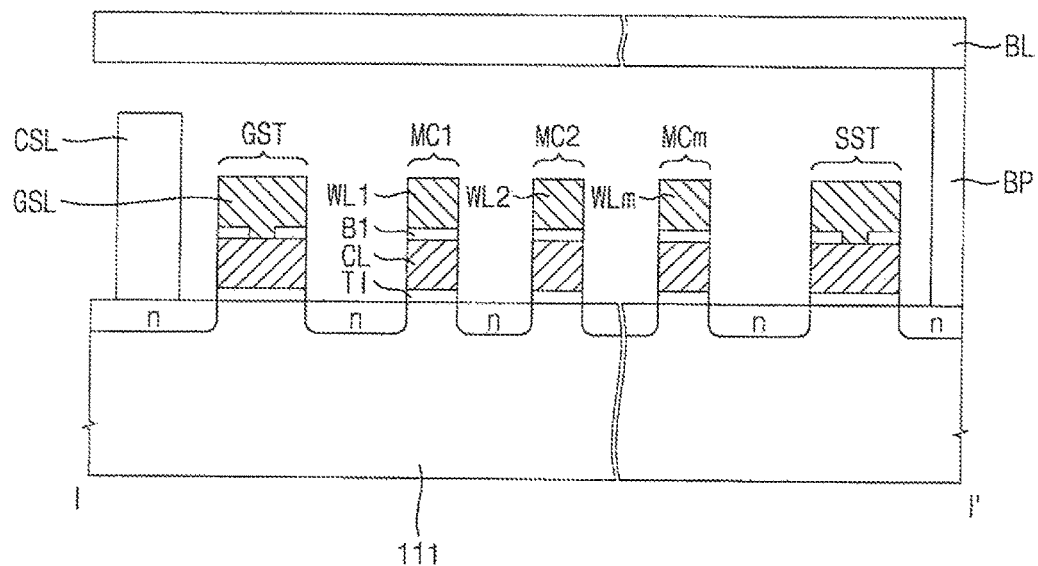
FIG. 4 is a sectional view taken along a line I-I' of the memory block of FIG. 3.

FIG. 3 is a perspective view illustrating one of the memory blocks of FIG. 2. FIG. 4 is a sectional view taken along a line I-I' of the memory block of FIG. 3.

Referring to FIGS. 3 and 4, a substrate 111 of the memory block BLKa is provided. For example, the substrate 111 is a well having a p-conductivity type.

A device isolation layer IL is provided on the substrate 111 to define an active region. In the illustrated example, it is shown that three active regions that extend along a third direction and are spaced along a first direction by a specific distance are defined. However, the number of active regions is not so limited.

A tunnel insulation layer TI is provided on each active region. In each active region, the tunnel insulation layers TI are spaced along the third direction by a specific distance. Each tunnel insulation layer TI may include an oxide layer. For example, each tunnel insulation layer TI may include a thermal oxide layer.

In each active region, charge storage layers CL are provided on the tunnel insulation layers TI. For example, the charge storage layers CL may include a conductive material, such as polysilicon. In some embodiments, each charge storage layer CL may include a nitride layer or a metal oxide layer (e.g., an aluminum oxide layer, or a hafnium oxide layer).

If the charge storage layers CL include a conductive material, such as polysilicon, the charge storage layers may operate as floating gates. That is, the charge storage layers CL store data by accumulating charges. If the charge storage layers CL include an insulation material, such as a nitride layer or a medal oxide layer, the charge storage layers operate as charge trapping layers. That is, the charge storage layers CL store data by trapping charges.

In the example illustrated in FIG. 3, the tunnel insulation layers TI and charge storage layers CL are provided along a first direction D1 on a plurality of active regions. On an axial line where the tunnel insulation layers TI and the charge storage layers CL are provided along the first direction D1, blocking insulation layers BI are provided along the first direction D1. Each blocking insulation layer BI may include a nitride layer. In some embodiments, each blocking insulation layer BI may include a high-k dielectric layer (e.g., an aluminum oxide layer, or a hafnium oxide layer) that has a higher dielectric constant than the dielectric constant of the tunneling insulation layers TI.

A polysilicon layer is provided on the tunnel insulation layers TI. The polysilicon layer extends along the first direction D1 on a plurality of active regions. The polysilicon layer is spaced along a third direction D3 by a specific distance.

Each of the tunneling insulation layer TI, the charge storage layer CL, the blocking insulation layer BI, and the polysilicon layer constitutes a gate structure. In an embodiment, each of the tunneling insulation layer TI, the charge storage layer CL, the blocking insulation layer BI, and the polysilicon layer may constitute a memory cell MC. In an embodiment, in a specific gate structure, a perforation may formed in the blocking insulation layer BI such that the polysilicon layer and the charge storage layer CL may be connected. This gate structure may form a string selection transistor SST or a ground selection transistor GST.

If the charge storage layer CL includes an insulation material, perforations may not be provided at a blocking insulation layer BI of a gate structure. That is, a charge storage layer CL and a control polysilicon layer of a gate structure of a selection transistor SST or GST may not be separated by a blocking insulation layer BI.

In some embodiments, a polysilicon layer forming a gate structure of a memory cell may extend along the first direction to form a word-line WL. In an embodiment, the polysilicon layer forming a gate structure of the selection transistor SST or GST extend along the first direction to form a string selection line SSL or ground selection line GSL.

Referring to FIG. 3, junction regions having an n-type conductivity type are formed between gate structures. At this point, a source and a drain of a selection transistor SST or GST can be formed simultaneously. A conductive material extending along the first direction is provided on a source of a ground selection transistor GST. This conductive material forms a common source line CSL. The common source line CSL may include, for example, polysilicon and/or metal.

A bit-line contact BP connected to a bit-line BL is provided on a drain of the string selection transistor SST. That is, a drain of the string selection transistor SST is connected to a corresponding bit-line BL through the bit-line contact BP. Bit lines are provided on the same axial line as the active regions. In the embodiments illustrated in FIGS. 3 and 4, three bit-lines are shown; however, the inventive concepts are not limited to devices with three bitlines.

Figure 5:
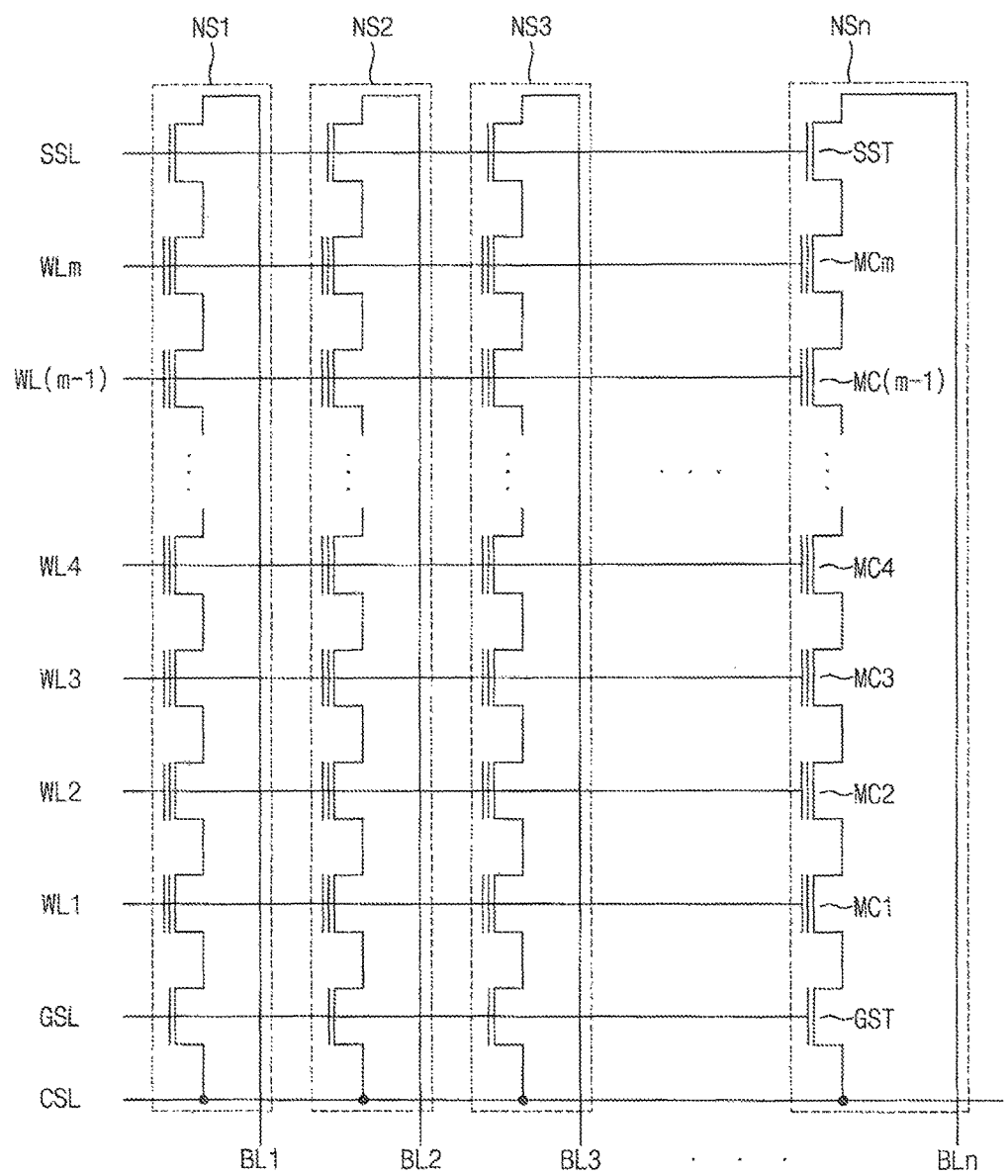
FIG. 5 is a circuit diagram illustrating an equivalent circuit of the memory block described with reference to FIGS. 3 and 4.

FIG. 5 is a circuit diagram illustrating an equivalent circuit of the memory block described with reference to FIGS. 3 and 4.

The memory block BLKa of FIG. 5 may be formed on a substrate in a two-dimensional structure (or a horizontal structure). For example, a plurality of memory cell strings included in the memory block BLKa may be formed in a direction parallel to the substrate.

Referring to FIG. 5, the memory block BLKa may include memory cell strings NS1 to NSm.

Each of the memory cell strings NS1 to NSm may include a string selection transistor SST, a plurality of memory cells MC, and a ground selection transistor GST that are connected to each other in series.

The string selection transistor SST included in each of the memory cell strings NS1 to NSm may be commonly connected to the string selection line SSL. Memory cells that are arranged in a same row among memory cells MC included in each of the memory cell strings NS1 to NSm may be commonly connected to corresponding word-lines WL1 to WLn. The ground selection transistor GST included in each of the memory cell strings NS1 to NSm may be commonly connected to the ground selection line GSL.

The ground selection transistors GST included in each of the memory cell strings NS1 to NSm may be commonly connected to the common source line CSL. The string selection transistor SST included in each of the memory cell strings NS1 to NSm may be connected to corresponding bit-lines BL1 to BLm. Here, n and m represent positive integers.

Figure 6:
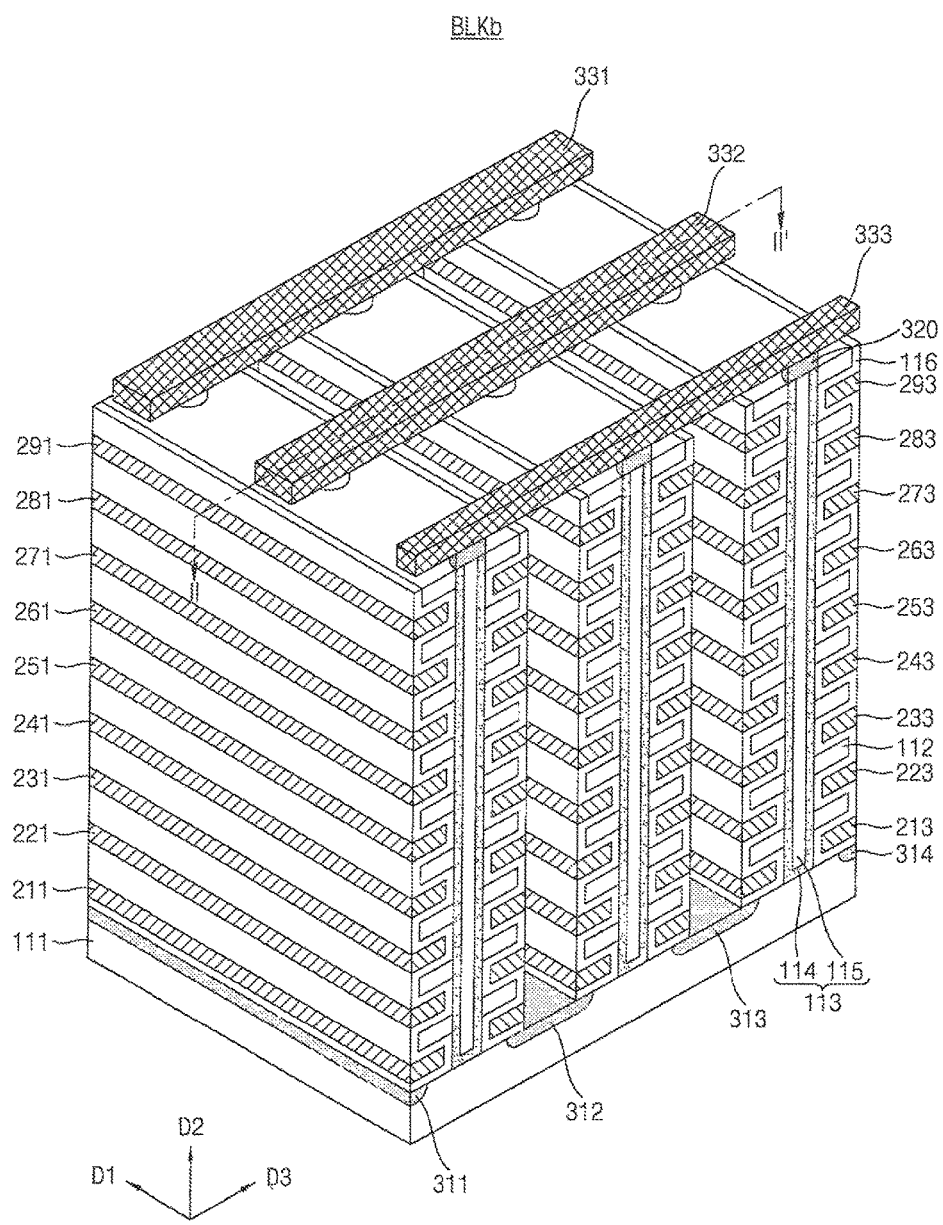
FIG. 6 is a perspective view illustrating one of memory blocks of FIG. 2.
Figure 7:
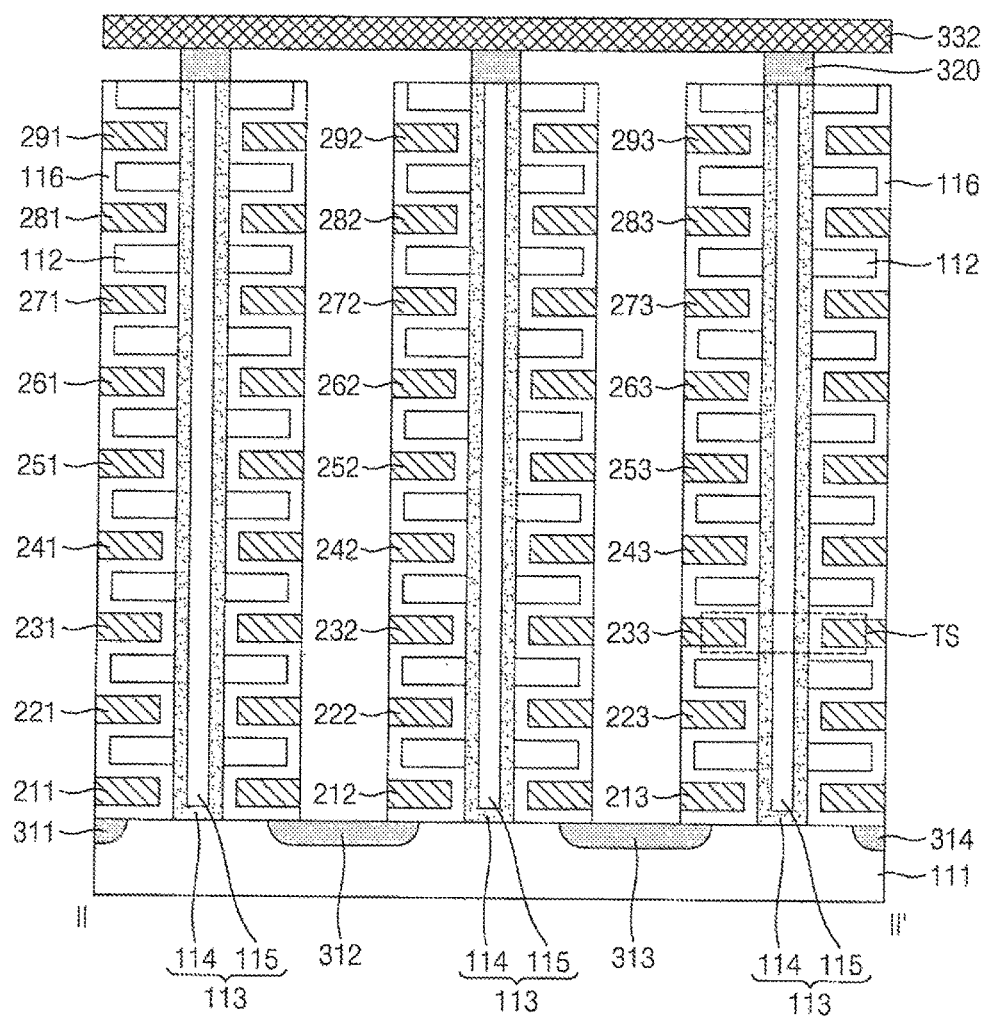
FIG. 7 is a sectional view taken along a line II-II' of the memory block of FIG. 6.

FIG. 6 is a perspective view illustrating one of memory blocks of FIG. 2 having a three dimensional or vertical structure. FIG. 7 is a sectional view taken along a line II-II' of the memory block of FIG. 6.

Referring to FIGS. 6 and 7, the memory block BLKb includes structures extending along the first to third directions D1~D3.

A substrate 111 is provided. For example, the substrate 111 may have a well of a first type (e.g., a first conductivity type). For example, the substrate 111 may have a p-well formed by implanting a group III element such as boron (B). For example, the substrate 111 may have a pocket p-well provided in an n-well. In an embodiment, the substrate 111 has a p-type well (or a p-type packet well). However, the conductivity type of the substrate 111 is not limited to p-type.

A plurality of doping regions 311 to 314 extending along the first direction D1 are provided on the substrate 111. For example, the plurality of doping regions 311 to 314 may have a second type (e.g., a second conductivity type) that is different from the first type of the substrate 111. In an embodiment, the first to fourth doping regions 311 to 314 have an n-type. However, the conductivity type of the first to fourth doping regions 311 to 314 is not limited to n-type.

A plurality of insulation materials 112 extending along the first direction D1 are sequentially provided along the second direction on a region of the substrate 111 between the first and second doping regions 311 and 312. For example, the plurality of insulation materials are stacked in the second direction D2 and are spaced by a specific distance. In some embodiments, the insulation materials 112 may include an insulating material, such as an oxide layer.

A plurality of pillars 113 that penetrate the insulation materials along the second direction D2 are sequentially disposed along the first direction on a region of the substrate 111 between the first and second doping regions 311 and 312. For example, the plurality of pillars 113 penetrate the insulation materials 112 to contact the substrate 111.

Each pillar 113 may include a plurality of materials. For example, a channel layer 114 of each pillar 113 may include a silicon material having a first conductivity type. The channel layer 114 of each pillar 113 may include a silicon material having the same type as the substrate 111. In some embodiments, the channel layer 114 of each pillar 113 includes p-type silicon. However, the channel layer 114 of each pillar 113 is not limited to p-type silicon.

An internal material 115 of each pillar 113 includes an insulation material. For example, the internal material 115 of each pillar 113 may include an insulating material, such as a silicon oxide. In some embodiments, the inner material 115 of each pillar 113 may include an air gap.

An insulation layer 116 is provided along the exposed surfaces of the insulation materials 112, the pillars 113, and the substrate 111, on a region between the first and second doping regions 311 and 312. In some embodiments, the insulation layer 116 provided on the exposed surface in the second direction D2 of the last insulation material 112 may be removed.

The thickness of the insulation layer 116 may be less than the half of the distance between the insulation materials 112. That is, a gap exists between adjacent ones of the insulation materials 112. The insulation layer is partially disposed in the gap between adjacent ones of the insulation materials, but is not thick enough to completely fill the gap. Rather, within each gap are exposed surfaces of the insulation layer 116. First conductive materials 211 to 291 are provided on the exposed surfaces of the insulation layer 116, in a region between the first and second doping regions 311 and 312. For example, the first conductive material 211, which extends along the first direction D1, is provided between the insulation material 112 adjacent to the substrate 111 and the substrate 111. In more detail, the first conductive material 211 is provided between the insulation layer 116 at the bottom of the insulation material 112 adjacent to the substrate 111 and the substrate 111.

A plurality of first conductive materials 221 to 281 extending along the first direction D1 are provided between respective ones of the insulation materials 112. The insulation layer 116 is provided between the insulation materials 112 and the first conductive materials 221 to 281. The first conductive materials 211 to 291 may include a metal material and/or a conductive material such as a polysilicon.

The same or similar structures as those on the first and second doping regions 311 and 312 may be provided in a region between the second and third doping regions 312 and 313. In the region between the second and third doping regions 312 and 313, a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 212 to 292 extending along the first direction are provided.

In a region between the third and fourth doping regions 313 and 314, the same or similar structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction and penetrating the plurality of insulation materials 112 along the third direction D3, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. The drains 320 may include silicon materials doped with a second type. For example, the drains 320 may include silicon materials doped to have an n-type conductivity. In an embodiment, the drains 320 include n-type silicon materials. However, the drains 320 are not limited to n-type silicon materials.

The width of each drain 320 may be greater than that of the pillar 113. For example, each drain 320 may be provided in a pad form on the top of the corresponding pillar 113. Each drain 320 may extend to a portion of the channel layer 114 of the corresponding pillar 113.

On the drains, the second conductive materials 331 to 333, which extend along the third direction D3, are provided. The second conductive materials 331 to 333 are disposed along the first direction D1 and are spaced apart from one another by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials and/or conductive materials, such as a polysilicon.

The heights of the first conductive materials 211 to 291, 212 to 292, and 213 to 293 will now be described. The first conductive materials 211 to 291, 212 to 292, and 213 to 293 sequentially have first to ninth heights from the substrate 111. That is, the first conductive materials 211 to 213 adjacent to the substrate 111 have the first height. The first conductive materials 291 to 293 adjacent to the second conductive materials 331 to 333 have the ninth height. As an order from the substrate 111 of a specific conductive material among the first conductive materials 211 to 291, 212 to 292, and 213 to 293 is increased, the height of the first conductive material is increased.

Referring to FIGS. 6 and 7, the pillars 113, the insulation layer 116, and the plurality of first conductive materials 211 to 291, 212 to 292, and 213 to 293 form a string. For example, each pillar 113, an adjacent region of the insulation layer 116, and an adjacent region of the first conductive materials 211 to 291, 212 to 292, and 213 to 293 form a NAND string NS. The NAND string NS includes a plurality of transistor structures TS.

Figure 8:
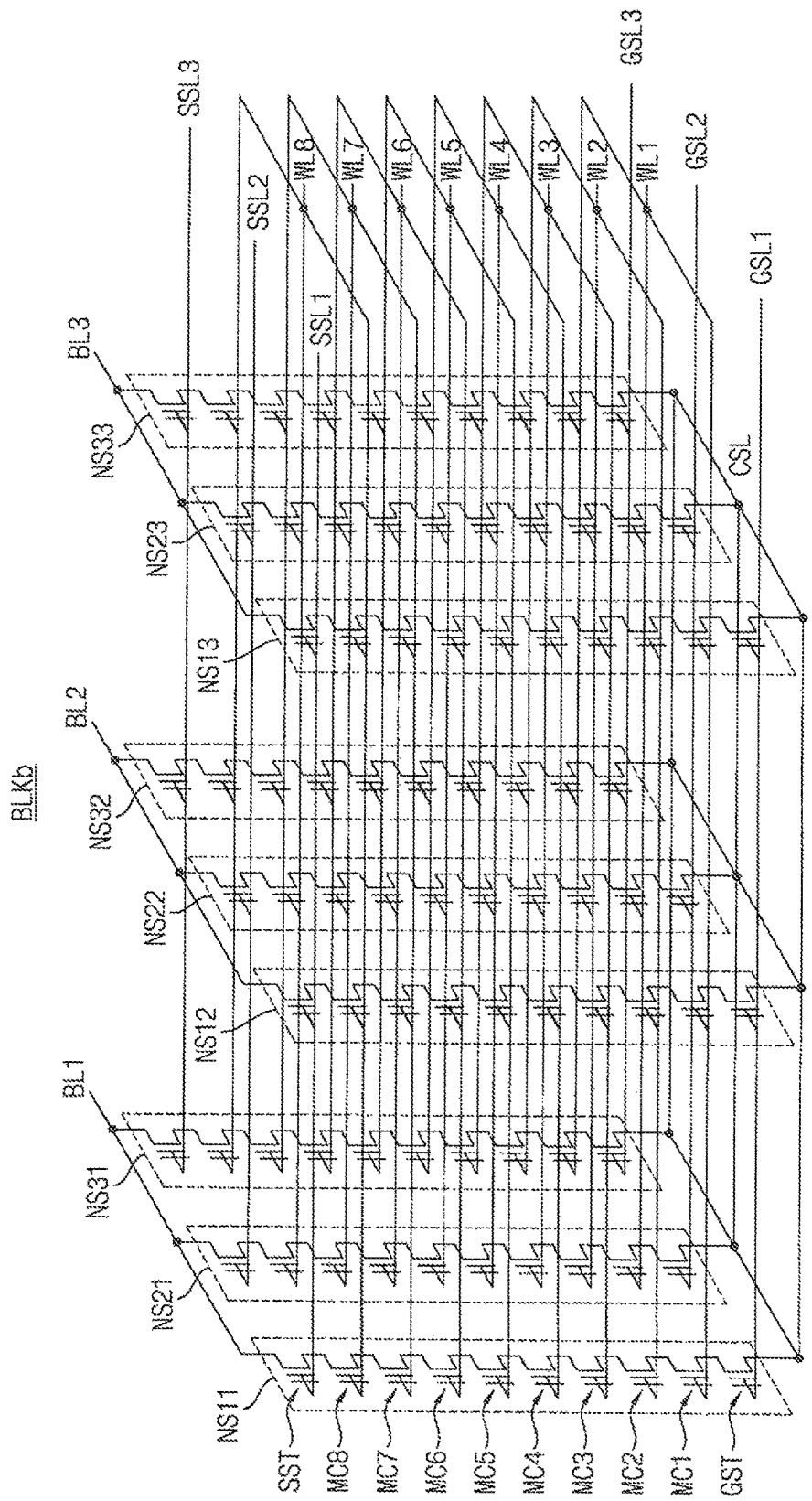
FIG. 8 is a circuit diagram illustrating an equivalent circuit of the memory block described with reference to FIGS. 6 and 7.

FIG. 8 is a circuit diagram illustrating an equivalent circuit of the memory block described with reference to FIGS. 6 and 7.

The memory block BLKb of FIG. 8 may be formed on a substrate in a three-dimensional structure (or a vertical structure). For example, a plurality of memory cell strings included in the memory block BLKb may be formed in a direction perpendicular to the substrate.

Referring to FIG. 8, the memory block BLKb may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 8, each of the memory cell strings NS1 to NS33 is illustrated to include eight memory cells MC1 to MC8. However, the inventive concepts are not limited thereto. Rather, each of the memory cell strings NS11 to NS33 may include an arbitrary number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 8, the memory block BLKb is illustrated to be coupled to eight word-lines WL1 to WL8 and three bit-lines BL1 to BL3. However, example embodiments are not limited thereto. In some example embodiments, the memory cell array 100a may be coupled to an arbitrary number of word-lines and bit-lines.

FIG. 8 illustrates the concepts of memory strings, pages and blocks. The memory cells connected in series between a particular ground selection transistor GST and string selection transistor SST form a string of memory cells. In FIG. 8, strings NS11, NS12 and NS13 are all formed between ground selection transistor GST1 and string selection transistor SST1.

All of the memory cells connected to a single word-line form a page of memory. Thus, for example, the memory cells MC1 in each of the strings NS11 to NS33 that are connected to the same word-line WL1 constitute a logical page of memory.

Finally, all of the memory pages formed by the same set of strings constitute a block of memory. Thus, the memory cells in each of the pages formed by the cells in the strings NS11 to NS33 collectively form a block BLKb of memory cells. All of the strings in the block BLKb may be connected to the same common source line CSL.

Referring again to FIG. 1, the control circuit 500 may receive a command signal CMD and an address signal ADDR from an external device, such as a memory controller, and control an erase loop, a program loop and a read operation of the nonvolatile memory device in response to the command signal CMD and the address signal ADDR. The program loop may include a program operation and a program verification operation. The erase loop may include an erase operation and an erase verification operation.

The control circuit 500 may generate control signals CTLs, which are used for controlling the voltage generator 700, in response to the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420. The control circuit 500 includes a dummy pulse controller 600. The dummy pulse controller 600 may control the voltage generator 700 such that the voltage generator 700 applies a periodic dummy pulse to at least some of the memory blocks BLK1 to BLKz after completion of the program loop and before a read operation is performed for reducing error bits in a read data during the read operation. A "dummy pulse" is a pulse applied to a word-line when an operation is not being performed on a page associated with the word-line. A dummy pulse can, for example, be the same voltage as a read pass voltage or read voltage that are normally applied to word-lines of the nonvolatile memory device during a read operation. However, when a dummy pulse is applied, no read operation is performed on the page.

The address decoder 430 may be coupled to the memory cell array 100 through the string selection line SSL, the plurality of word-lines WLs, and the ground selection line GSL. During the program operation or the read operation, the address decoder 200 may select one of the plurality of word-lines WLs as a first word-line (i.e., a selected word-line). The remaining word-lines WLs other than the first word-line are unselected word-lines UNSEL_WL based on the row address R_ADDR.

The voltage generator 700 may generate word-line voltages VWLs, which are required for the operation of the nonvolatile memory device 10, based on the control signals CTLs. The word-line voltages VWLs may be applied to the plurality of word-lines WLs through the address decoder 430.

During the erase operation, the voltage generator 700 may apply an erase voltage to a well of the memory block and may apply a ground voltage to all of the word-lines of the memory block. During the erase verification operation, the voltage generator 600 may apply an erase verification voltage to all of the word-lines of the memory block or sequentially apply the erase verification voltage to selected word-lines.

During the program operation, the voltage generator 700 may apply a program voltage to the first word-line and may apply a program pass voltage to the unselected word-lines. In addition, during the program verification operation, the voltage generator 700 may apply a program verification voltage to the first word-line and may apply a verification pass voltage to the unselected word-lines.

In addition, during the read operation, the voltage generator 700 may apply a read voltage to the first word-line and may apply a read pass voltage to the unselected word-lines.

According to some embodiments, prior to the read operation, the voltage generator 700 may apply a dummy pulse to at least some of the memory blocks BLK1 to BLKz in response to a dummy pulse control signal DPC so that a voltage difference between the first word-line and the unselected word-lines may be reduced before the read operation is performed.

The page buffer circuit 410 may be coupled to the memory cell array 100 through the plurality of bit-lines BLs. The page buffer circuit 410 may include a plurality of page buffers. In some example embodiments, one page buffer may be connected to a single bit-line. In other example embodiments, one page buffer may be connected to two or more bit-lines.

The page buffer circuit 410 may temporarily store data to be programmed in a selected page or data read out from the selected page.

The data input/output circuit 420 may be coupled to the page buffer circuit 410 through data lines DL. During the program operation, the data input/output circuit 410 may receive program data DATA from an external device (e.g., a memory controller) and provide the program data DATA to the page buffer circuit 410 based on the column address C_ADDR received from the control circuit 500. During the read operation, the data input/output circuit 420 may provide read data DATA, which are stored in the page buffer circuit 410, to the external device based on the column address C_ADDR received from the control circuit 500.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

Figure 9:
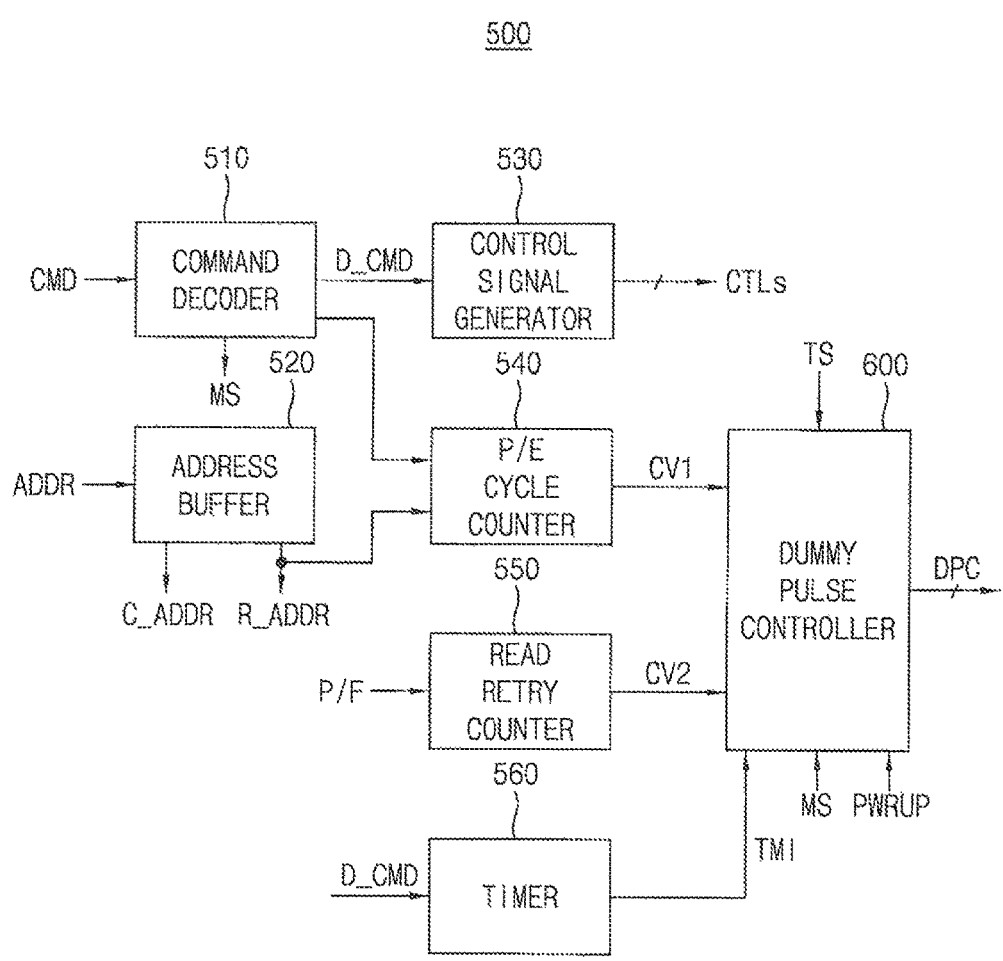
FIG. 9 is a block diagram illustrating the control circuit in the nonvolatile memory device of FIG. 1 according to example embodiments.

FIG. 9 is a block diagram illustrating the control circuit in the nonvolatile memory device of FIG. 1 according to example embodiments.

Referring to FIG. 9, the control circuit 500 includes a command decoder 510, an address buffer 520, a control signal generator 530, a program/erase cycle counter 530, a read retry counter 550, a timer and a dummy pulse controller 600.

The command decoder 510 decodes the command CMD and provides a decoded command D_CMD to the control signal generator 570. The command decoder 510 provides the decoded command D_CMD to the program/erase cycle counter 530 when the decoded command D_CMD is a program command or an erase command. In addition, the command decoder 510 provides the decoded command D_CMD to the timer 560 when the decoded command D_CMD is a program command or an erase command. The command decoder 510 provides the dummy pulse controller 600 with a mode signal MS indicating an operation directed by the decoded command D_CMD.

The address buffer 520 receives the address signal ADDR, provides the row address R_ADDR to the program/erase cycle counter 540 and the address decoder 430 and provides the column address C_ADDR to the data input/output circuit 420.

The control signal generator 530 receives the decoded command D_CMD, generates the control signals CTLs based on an operation directed by the decoded command D_CMD and provides the control signals CTLs to the voltage generator 700.

The program/erase cycle counter 540 counts a number of program/erase cycle on the selected memory cells based on the decoded command D_CMD and the row address R_ADDR and provides the dummy pulse controller 600 with a first counting value CV1. The first counting value CV1 indicates the counted number of the program/erase cycle on the selected memory cells. The first counting value CV1 may indicate a number of memory cells of a particular memory block that have been programmed since the last time the memory block was erased.

The read retry counter 550 receives a pass/fail information on a read data from an external memory controller, counts a number of a read retries on the selected page and provides the dummy pulse controller 600 with a second counting value CV2 which indicates the counted number of read retries. The pass/fail information on the read data may indicate whether the read data includes at least one error bit.

The timer 560 calculates an elapsed time from a time point when the decoded command D_CMD and provides the dummy pulse controller 600 with a time information TMI which indicates the calculated elapsed time.

The dummy pulse controller 600 provides dummy pulse control signals DPC to the voltage generator 700 based on at least one of the first counting value CV1, the second counting value CV2, the mode signal MS, the temperature signal TS, the time information TI and a power-up signal PWRUP. The dummy pulse control signal DPC may include a plurality of bits. Some of the bits of the dummy pulse control signal DPC may designate some of the memory blocks BLK1~BLKz to which the periodic dummy pulse is applied, according to the mode signal MS.

Figure 10:
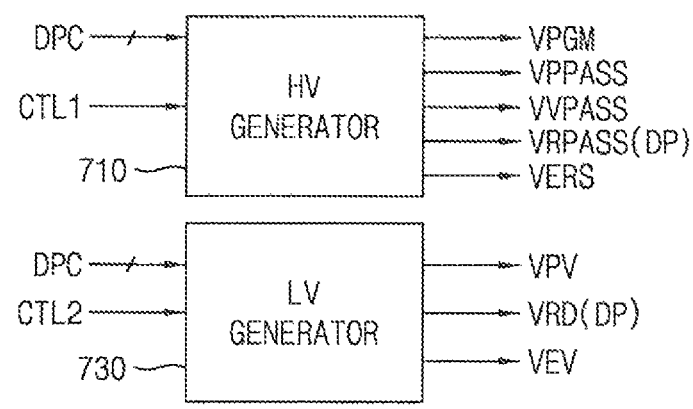
FIG. 10 is a block diagram illustrating the voltage generator in the nonvolatile memory device of FIG. 1 according to example embodiments.

FIG. 10 is a block diagram illustrating a voltage generator in a nonvolatile memory device of FIG. 1 according to some embodiments of the inventive concepts.

Referring to FIG. 10, the voltage generator 700 includes a high voltage generator 610 and a low voltage generator 730.

The high voltage generator 710 may generate a program voltage PGM, a program pass voltage VPPASS, a verification pass voltage VVPASS, a read pass voltage VRPASS and an erase voltage VERS according to operations directed by the decoded command D_CMD, in response to a first control signal CTL1. The program voltage PGM is applied to the first word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command D_CMD and the number of the program/erase cycles indicated by the comparison signal CS.

In addition, the high voltage generator 710 may periodically apply the read pass voltage VRPASS as a dummy pulse DP to at least some of the memory blocks BLK1~BLKz in response to the dummy pulse control signal DPC.

In some example embodiments, the at least some of the memory blocks BLK1~BLKz may include all of the memory blocks BLK1~BLKz and other pages of a selected memory block besides a selected page of the selected memory block. In some example embodiments, the at least some of the memory blocks BLK1~BLKz may include at least one page which is randomly selected from a selected memory block. In some example embodiments, the at least some of the memory blocks BLK1~BLKz may include at least two memory blocks of the memory blocks BLK1~BLKz.

The low voltage generator 730 may generate a program verification voltage VPV, a read voltage VRD and an erase verification voltage VER according to operations directed by the decoded command D_CMD, in response to a second control signal CTL2. The program verification voltage VPV, the read voltage VRD and the erase verification voltage VER may be applied to the first word-line according to operation of the nonvolatile memory device 100. The second control signal CTL2 may include a plurality of bits which indicate the operations directed by the decoded command D_CMD and the number of the program/erase cycles indicated by the comparison signal CS.

In addition, the low voltage generator 730 may periodically apply the read voltage VRD as the dummy pulse DP to at least some of the memory blocks BLK1~BLKz in response to the dummy pulse control signal DPC.

Although not illustrated, the voltage generator 700 may further include a negative voltage generator. The negative voltage generator may generate a program verification voltage, a read voltage and an erase verification voltage which have negative levels according to operations directed by the decoded command D_CMD, in response to a control signal from the control circuit 500. The negative voltage generator may apply the program verification voltage, the read voltage and the erase verification voltage to the word-lines WLs through the address decoder 430.

Figure 11:
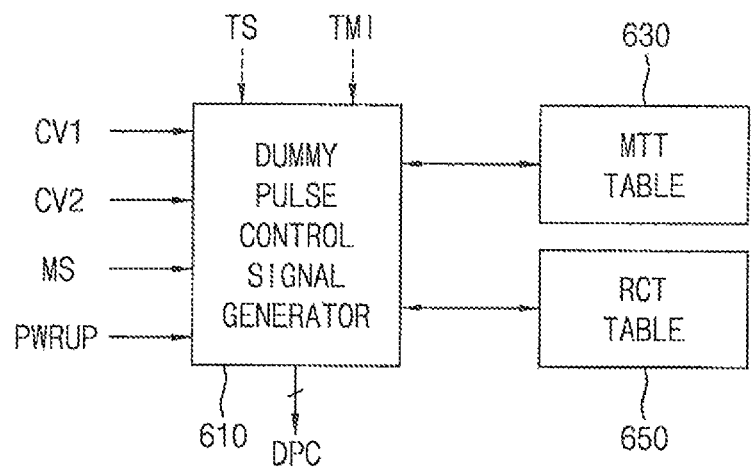
FIG. 11 is a block diagram illustrating the dummy pulse controller in the control circuit of FIG. 9 according to example embodiments.

FIG. 11 is a block diagram illustrating the dummy pulse controller in the control circuit of FIG. 9 according to example embodiments.

Figures 12, 13:
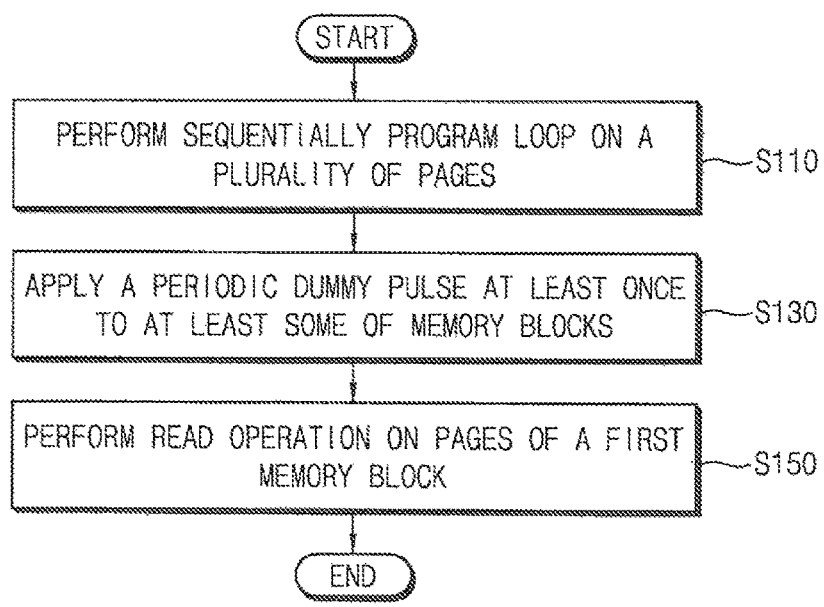
FIG. 12 illustrates a first table and a second table in the dummy pulse controller in FIG. 11.
FIG. 13 is a flow chart illustrating a method of operating a nonvolatile memory device according to example embodiments.

FIG. 12 illustrates a first table and a second table in the dummy pulse controller in FIG. 11.

Referring to FIGS. 11 and 12, the dummy pulse controller 600 includes the dummy pulse control signal generator 610, a first table 630 and a second table 650.

The first table 630 may stores a number of program/erase cycles 631 of the selected memory block or the selected page and a maximum timer threshold (MTT) 633. The MTT 633 may indicate a maximum threshold value of an elapsed time from a completion of the program loop. The MTT 633 may represent a maximum interval of an application time of the dummy pulse DP for preventing the error bits in the read data from increasing after the completion of the program loop. The MTT 633 may be determined by testing the nonvolatile memory device 10. The number of program/erase cycles 631 and the MT 633 may be updatable. The dummy pulse control signal generator 610 may adjust an application interval of the dummy pulse DP by referring to the number of the program/erase cycles 631 and the MTT 633.

The second table 650 may store a number of program/erase cycles 651 of the selected memory block or the selected page and a retry count threshold (RCT) 653. The RCT 653 may indicate a maximum threshold value of a number of a read retries. The RCT 653 may represent a maximum number of read retry operations in which the dummy pulse DP is applied for preventing the error bits in the read data from increasing after the completion of the program loop. The RCT 653 may be determined by testing the nonvolatile memory device 10. The number of a program/erase cycles 651 and the RCT 653 may be updatable. The dummy pulse control signal generator 610 may adjust an application interval of the dummy pulse DP by referring to the number of the program/erase cycles 651 and the RCT 653.

The dummy pulse control signal generator 600 may apply the dummy pulse control signal DPC to one of the high voltage generator 710 and the low voltage generator 730 based on at least one of the first counting value CV1, the second counting value CV2, the mode signal MS, the power-up signal PWRUP, the temperature signal TS and the time information TMI.

The high voltage generator 710 may periodically apply the read pass voltage VRPASS as the dummy pulse DP to at least some of the memory blocks BLK1~BLKz in response to the dummy pulse control signal DPC. The low voltage generator 730 may periodically apply the read voltage VRD as the dummy pulse DP to at least some of the memory blocks BLK1~BLKz in response to the dummy pulse control signal DPC.

For example, when the dummy pulse control signal generator 610 receives the power-up signal that is enabled, from the outside, the dummy pulse control signal generator 610 provides the dummy control signal DPC to the voltage generator 700 such that the voltage generator 700 periodically applies the dummy pulse DP to all of the memory blocks BLK1~BLKz. The power-up signal PWRUP may be enabled when a power supplied to the nonvolatile memory device 10 is cut off and then supplied to the nonvolatile memory device 10 again.

In some embodiments, when the mode signal MS indicates an idle state in which the control circuit 500 does not receive the command signal CMD and the address signal ADDR during a predetermined interval, the dummy pulse control signal generator 610 may provide the dummy control signal DPC to the voltage generator 700 in response to the mode signal MS indicating the idle state, such that the voltage generator 700 periodically applies the dummy pulse DP to at least some of the memory blocks BLK1~BLKz.

In some embodiments, when the mode signal MS indicates that the nonvolatile memory device 10 wakes up from a power down mode, the dummy pulse control signal generator 610 may provide the dummy control signal DCP to the voltage generator 700 in response to the mode signal MS indicating the wake-up, such that the voltage generator 700 periodically applies the dummy pulse DP to at least some of the memory blocks BLK1~BLKz.

In some embodiments, when the mode signal MS indicates a normal operation mode of the nonvolatile memory device 10 and the temperature signal TS indicates that the operating temperature of the nonvolatile memory device 10 exceeds a reference temperature, the dummy pulse control signal generator 610 may provide the dummy control signal DPC to the voltage generator 700 in response to the temperature signal TS, such that the voltage generator 700 applies, DP to at least some of the memory blocks BLK1~BLKz, the dummy pulse with a period shorter than a period of the dummy pulse DP when the nonvolatile memory device 10 in a temperature not greater than the reference temperature. The dummy pulse controller 600 may further include additional table that stores an operating temperature and an application interval of the dummy pulse DP associated with the operating temperature. That is, the dummy pulse control signal generator 610 may apply the dummy pulse control signal DPC to the voltage generator 700 such that the voltage generator 700 applies the dummy pulse DP in cooperation with the operating temperature of the nonvolatile memory device 10.

In some embodiments, when the mode signal MS indicates a normal operation mode of the nonvolatile memory device 10 and that the program loop is completed on the memory cell array 100, the dummy pulse control signal generator 610 may determine an application timing of the dummy pulse DP which is to be applied to the at least some of the memory blocks BLK1~BLKz according to the number of the program/erase cycle 631 of the memory block and the MIT 633 of the memory block based on the first counting value CV1 and the time information TMI and by referring to the first table 630.

As illustrated in FIG. 12, the application interval of the dummy pulse DP after completion of the program loop may decrease as the number of the program/erase cycles 631 increases. Since a performance of the nonvolatile memory device 10 may degrade as the number of program/erase cycles 631 increases, the MTT 633 may be adjusted to decrease, and the MTT 633 may be used as the criteria for determining the application interval of the dummy pulse DP after completion of the program loop. That is, the pulse control signal generator 610 may apply the dummy pulse control signal DPC to the voltage generator 700 such that the voltage generator 700 applies the dummy pulse DP in cooperation with at least one of the number of the program/erase cycles 631 and the MTT 633.

In some embodiments, when the mode signal MS indicates a normal operation mode of the nonvolatile memory device 10, a read data may be provided to the memory controller after a read operation is performed on one of the memory blocks BLK1~BLKz of the memory cell array 100. When the read data from pages in one memory block has at least one error bit, the dummy pulse control signal generator 610 may determine an application timing of the dummy pulse DP which is to be applied to the at least some of the memory blocks BLK1~BLKz according to the number of the program/erase cycles 651 of the memory block and the RTT 653 of the memory block based on the second counting value CV2 and by referring to the second table 650.

As illustrated in FIG. 12, the RTT 653 may increase as the number of program/erase cycles 651 increases. The RTT 653 may be used as the criteria for determining the application interval of the dummy pulse DP after completion of the program loop. Since a performance of the nonvolatile memory device 10 may degrade as the number of program/ erase cycles 631 increases, the RTT 653 may be adjusted to increase.

FIG. 13 is a flow chart illustrating methods of operating a nonvolatile memory device according to example embodiments.

Referring to FIGS. 1 through 13, in a method of operating a nonvolatile memory device 10, a program loop is sequentially performed on a plurality of pages of a first memory block BLK1 of the memory blocks BLK1~BLKz of a memory cell array 100 (S110). The memory blocks BLK1~BLKz may be formed vertically with respect to a substrate 111. A periodic dummy pulse DP is applied to at least some of the memory blocks BLK1~BLKz at least once before a read operation is performed on a first page that is selected from a plurality of pages of the first memory block BLK1 (S130). The first page is coupled to a first word-line. A read operation is then performed on the pages of the first memory block BLK1 (S150).

Figure 14:
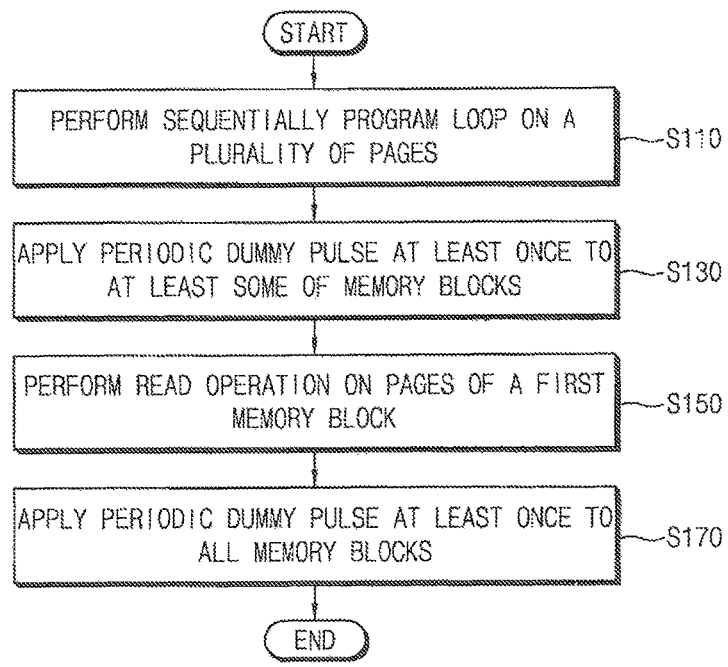
FIG. 14 is a flow chart illustrating a method of operating a nonvolatile memory device according to example embodiments.

FIG. 14 is a flow chart illustrating methods of operating a nonvolatile memory device according to example embodiments.

The method of FIG. 14 differs from the method of FIG. 13 in that the method of operating a nonvolatile memory device of FIG. 14 further includes a step (S170) of applying a dummy pulse at least once to all memory blocks after performing the read operation.

Referring to FIGS. 1 through 14, in a method of operating a nonvolatile memory device 10, after the read operation is performed on the pages of the first memory block BLK1, a read data is provided to a memory controller (a controller 1200 in FIG. 20), the memory controller determines whether the read data includes at least one error bit using an error correction code (ECC). When the read data includes the error bit, the memory controller provides a pass/fail information to the control circuit 500, and the control circuit 500 performs a read retry operation on a page including the at least one error bit. When error bits occur consecutively for at least a reference number of times, the dummy pulse control signal generator 610 may apply the dummy pulse control signal DPC to the voltage generator 700 such that the voltage generator 700 applies the dummy pulse DP to all of the memory blocks BLK1~BLKz at once (S170). In some example embodiments, the step (S130) may be omitted in the method of operating a nonvolatile memory device.

Figure 15:
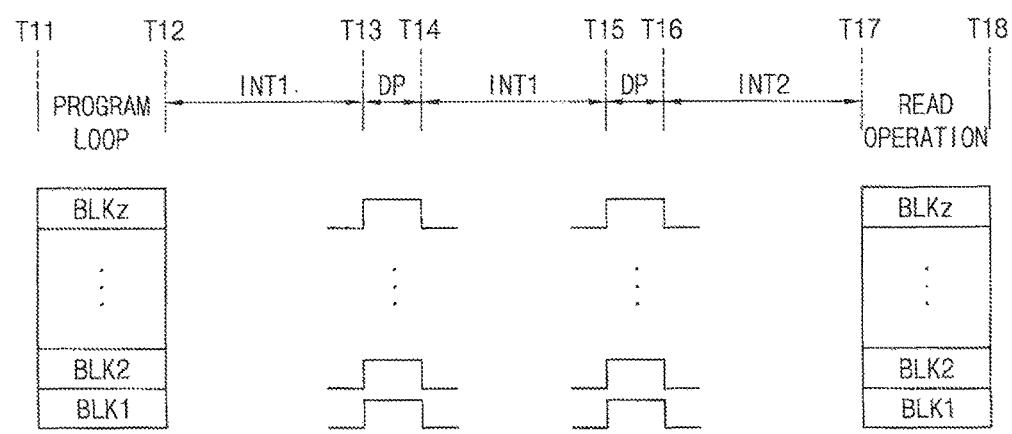
FIG. 15 illustrates an operation of the nonvolatile memory device of FIG. 1 according to example embodiments.

FIG. 15 illustrates operations of the nonvolatile memory device of FIG. 1 according to example embodiments.

Referring to FIGS. 1 through 12 and 15, a program loop is sequentially performed on the memory blocks BLK1~BLKz between time points T11~T12, and respective data is stored in each of the memory blocks BLK1~BLKz. A dummy pulse DP is applied to all or some of the memory blocks BLK1~BLKz from a time point T13 to a time point T14. The program loop is completed at the time point T12 and an interval INT1 elapses from the time point T12 to the time point T13. After the time interval INT1 has elapsed from time point T14 to a time point T15, a dummy pulse DP is again applied to all or some of the memory blocks BLK1~BLKz from the time point T15 to a time point T16. Another interval INT2 elapses from the time point T16 to a time point T17. A read operation is performed on a selected memory block of the memory blocks BLK1~BLKz from the time point T17 to a time point T18.

If the read operation is performed on the selected memory block without applying the dummy pulse DP to all or some of the memory blocks BLK1~BLKz, a number of error bits in the read data from a selected page may increase because of a voltage difference between a selected word-line coupled to the selected page and unselected word-lines coupled to unselected pages. However, according to some embodiments, the increase of the error bits may be prevented or reduced by applying the dummy pulse DP to all or some of the memory blocks BLK1~BLKz before performing the read operation to decrease the voltage difference between the selected word-line and the unselected word-lines.

Figure 16:
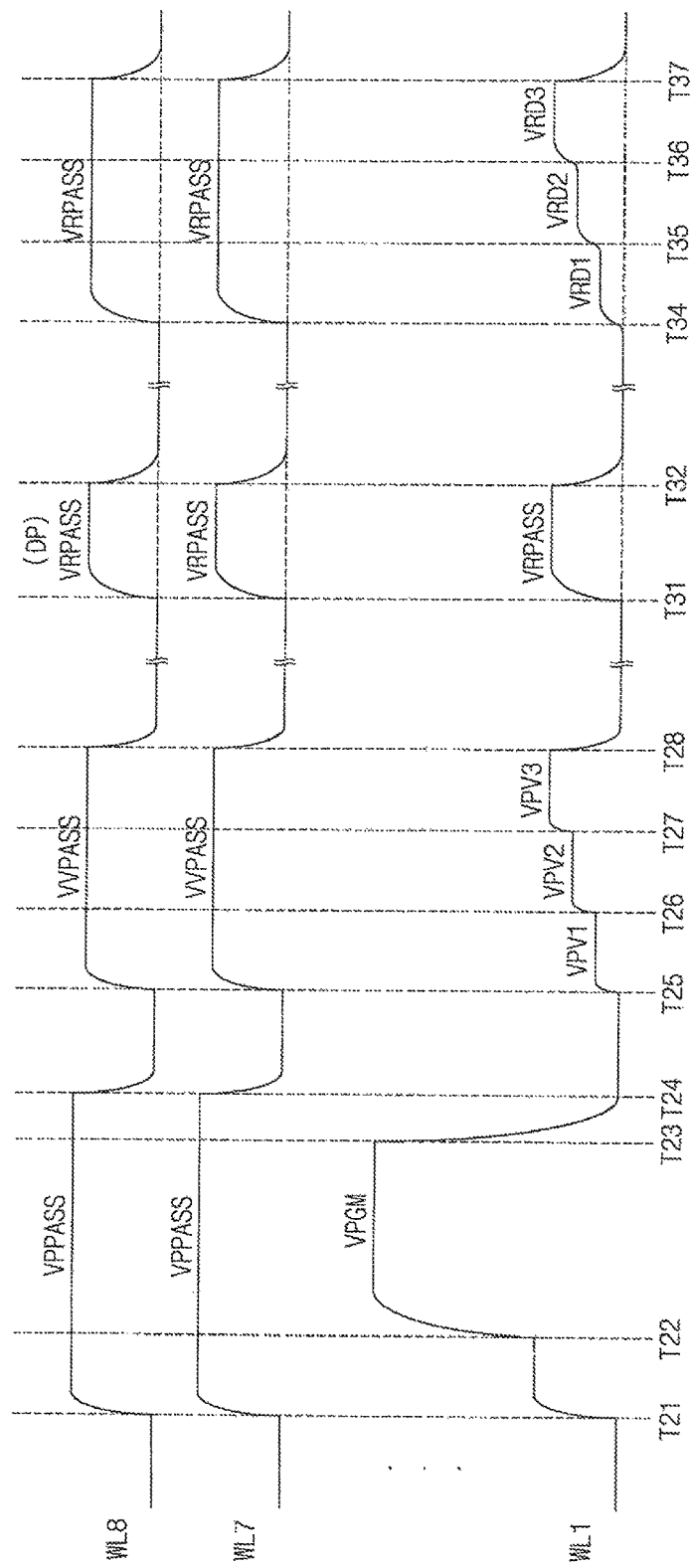
FIG. 16 is a diagram for describing an operation of one memory block in the nonvolatile memory device of FIG. 1.

FIG. 16 is a timing diagram that illustrates operations of a memory block in the nonvolatile memory device of FIG. 1 in accordance with some embodiments.

In FIG. 16, a first word-line WL1 corresponds to a selected word-line, and second through eighth word-lines WL2~WL8 correspond to unselected word-lines.

For example, in a program stage of a program loop of FIG. 16, at a time point T21, the high voltage generator 710 may apply the program pass voltage VPPASS to the first word-line WL and may apply the program pass voltage VPPASS to the unselected word-lines.

At a time point T22, the high voltage generator 710 may perform the program operation on the first memory cells connected to the first word-line WL1 by applying the program voltage VPGM, which is higher than the program pass voltage VPPASS, to the selected word-line WL1.

At time point T23, the selected word-line WL1 may be discharged to the ground voltage GND. At a time point T24, the unselected word-lines WL2~WL8 may be discharged to the ground voltage GND.

In the program verification stage of the program loop, at a time point T25, the low voltage generator 730 may apply the first program verification voltage VPV1 to the selected word-line WL1, and the high voltage generator 710 may apply the verification pass voltage VVPASS to the unselected word-lines WL2~WL8.

After the voltage of the selected word-line WL1 is stabilized to the first program verification voltage VPV1 at the time point T25, the nonvolatile memory device 10 may perform a program verification operation on the first memory cells based on the first program verification voltage VPV1.

At a time point T26, the low voltage generator 730 may apply may apply the second program verification voltage VPV2 to the selected word-line WL1, and perform the program verification operation on the first memory cells based on the second program verification voltage VPV2.

At time point T27, the low voltage generator 730 may apply may apply the third program verification voltage VPV3 to the selected word-line WL1, and perform the program verification operation on the first memory cells based on the third program verification voltage VPV3.

At a time point T28, the selected word-line WL1 and the unselected word-lines WL2~WL8 may be discharged to the ground voltage GND.

After an interval, which may be predetermined, elapses from the time point T28, at a time point T31, the dummy pulse controller 600 may provide the dummy pulse control signal DPC to the high voltage generator 710 such that the high voltage generator 710 applies the read pass voltage VRPASS as the dummy pulse DP to the word-lines WL1~WL8. In some embodiments, the dummy pulse DP may not be applied to the selected word-line WL1 between time points T31~T32. At time point T34, the selected word-line WL1 and the unselected word-lines WL2~WL8 may be discharged to the ground voltage GND.

After an interval elapses from the time point T32 to time point T34, the voltage generator 700 applies the first read voltage VRD1 to the first word-line WL1 and applies the read pass voltage VRPASS to the unselected word-lines WL2~WL8. After the voltage of the first word-line WL1 is stabilized to the first read voltage VRD1 at the time point T34, the nonvolatile memory device 10 may determine whether the first memory cell coupled to the first word-line WL1 is turned on.

At time point T35, the voltage generator 700 applies the second read voltage VRD2, which is higher than the first read voltage VRD1, to the first word-line WL1 and determines whether the selected memory cell coupled to the selected word-line WL1 is turned on. At a time point T36, the voltage generator 700 applies the third read voltage VRD3, which is higher than the second read voltage VRD2, to the first word-line WL1 and determines whether the selected memory cell coupled to the selected word-line WL1 is turned on. At a time point T37, the first word-line WL1 and the unselected word-lines WL2~WL8 may be discharged to the ground voltage GND.

Figure 17:
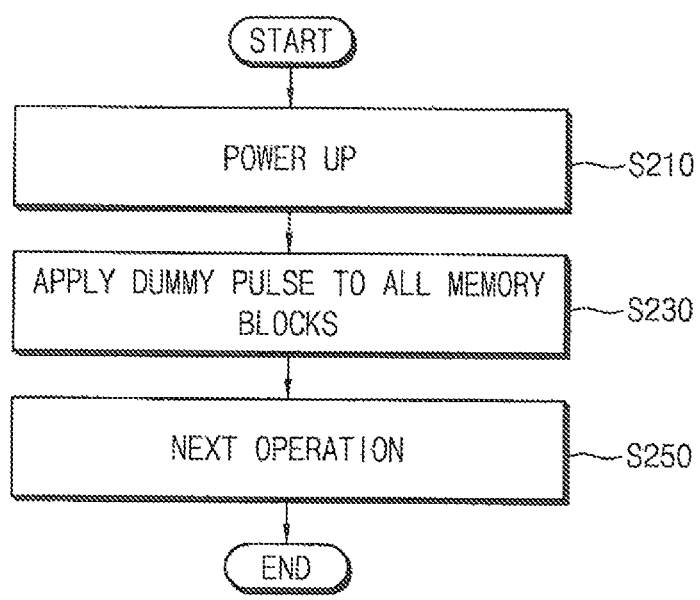
FIG. 17 is a flow chart illustrating an operation of the nonvolatile memory device of FIG. 1.

FIG. 17 is a flow chart illustrating operations of the nonvolatile memory device of FIG. 1 according to some embodiments.

FIG. 17 illustrates an example when the nonvolatile memory device 10 of FIG. 1 is powered-up.

Referring to FIGS. 1 through 12 and 17, when a power is supplied to the nonvolatile memory device 10 (S210), an enabled power-up signal PWRUP is applied to the dummy pulse control signal generator 610. The dummy pulse control signal generator 610 provides the dummy control signal DPC to the voltage generator 700 such that the voltage generator 700 periodically applies the dummy pulse DP to all of the memory blocks BLK1~BLKz (S230). The nonvolatile memory device 10 may perform a next operation (S250).

Figure 18:
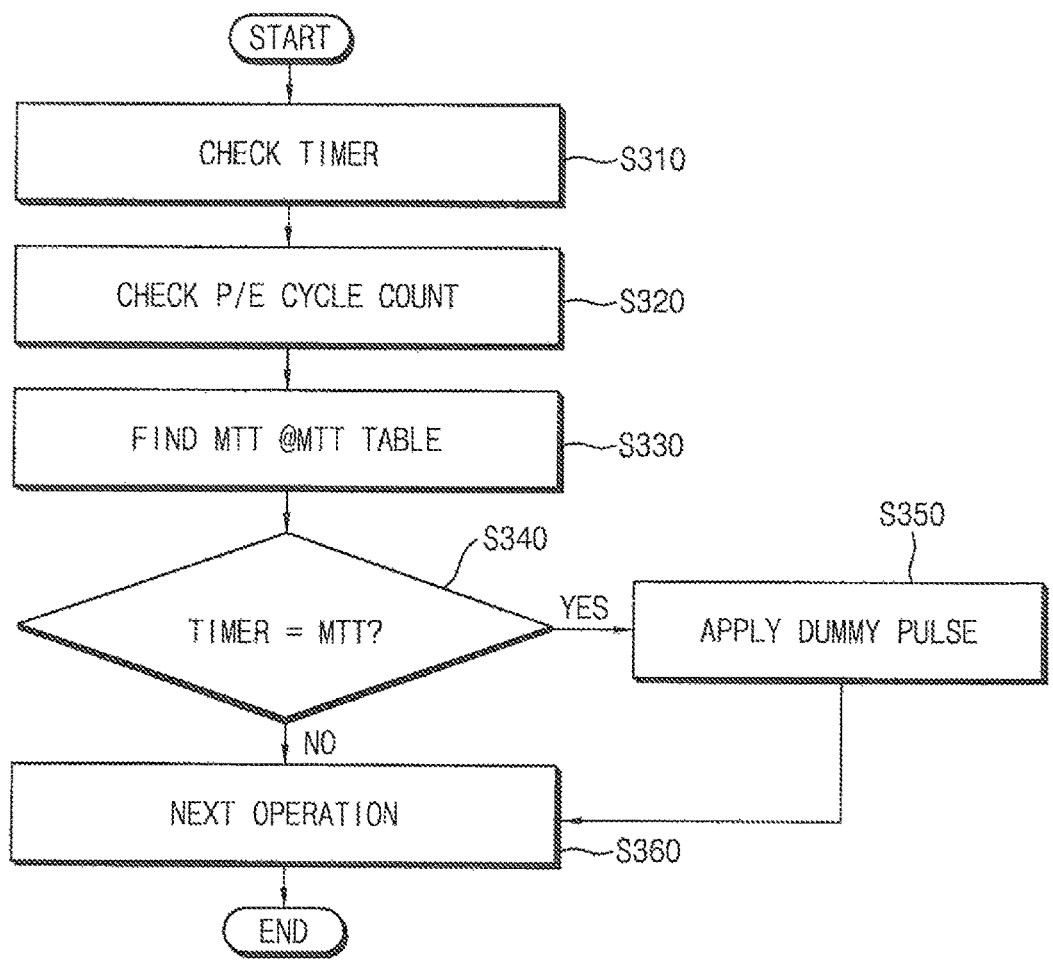
FIG. 18 is a flow chart illustrating an operation of the nonvolatile memory device of FIG. 1.

FIG. 18 is a flow chart illustrating operations of the nonvolatile memory device of FIG. 1 according to further embodiments.

FIG. 18 illustrates an example when a power is consecutively supplied to the nonvolatile memory device 10 of FIG. 1.

Referring to FIGS. 1 through 12 and 18, when the mode signal MS indicates a normal operation mode of the nonvolatile memory device 10 and that the program loop is completed on the memory cell array 100, the dummy pulse control signal generator 610 may check the time information TMI (S310), may check the first counting value CV1 (S320) and may refer to the first table 630 (S330) to determine whether the time information TMI matches the MTT (S340). When the time information TMI matches the MTT (YES in S340), the dummy pulse control signal generator 610 provides the dummy control signal DCP to the voltage generator 700 such that the voltage generator 700 applies the dummy pulse DP to at least some of the memory blocks BLK1~BLKz (S350) based on the number of the program/erase cycles 631 and the elapsed time from the completion of the programming loop 633. The nonvolatile memory device 10 then performs a next operation (S360). When the time information TMI does not match the MTT (NO in S340), the nonvolatile memory device 10 may perform the next operation (S360) without applying the dummy pulse DP to at least some of the memory blocks BLK1~BLKz.

Figure 19:
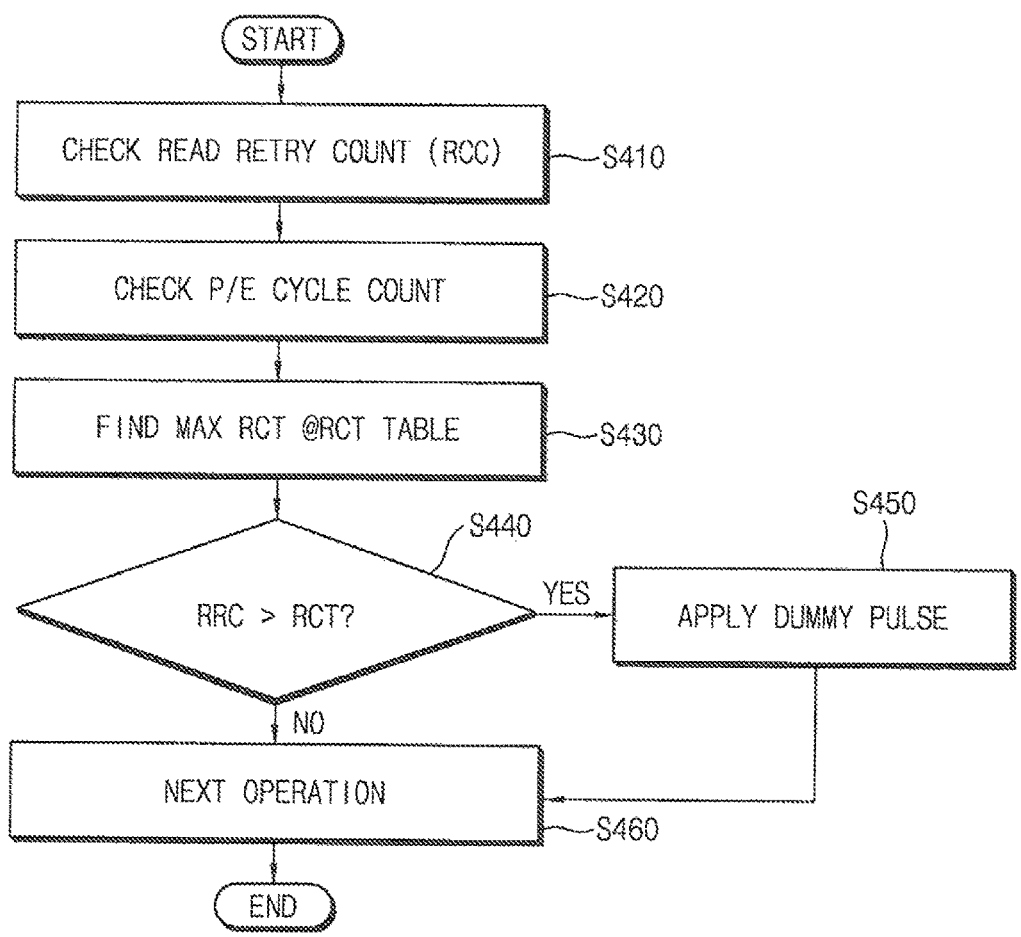
FIG. 19 is a flow chart illustrating an operation of the nonvolatile memory device of FIG. 1.

FIG. 19 is a flow chart illustrating operations of the nonvolatile memory device of FIG. 1 according to further embodiments.

FIG. 19 illustrates an example when the nonvolatile memory device 10 of FIG. 1 transmits the read data to a memory controller.

Referring to FIGS. 1 through 12 and 19, when the nonvolatile memory device 10 transmits the read data to the memory controller, the memory controller provides the pass/fail information P/F of the read data to the nonvolatile memory device 10. The dummy pulse control signal generator 610 checks a read retry count (RCC) based on the second counting value CV2 (S410). In addition, the dummy pulse control signal generator 610 may check the first counting value CV1 (S420) and may refer to the second table 650 (S430) to determine whether the RCC is greater than the RCT (S440). When the RCC is greater than the RCT (YES in S440), the dummy pulse control signal generator 610 provides the dummy control signal DPC to the voltage generator 700 to cause the voltage generator 700 to apply the dummy pulse DP to at least some of the memory blocks BLK1~BLKz (S450) based on the number of the program/erase cycle 651 and the RCC. The nonvolatile memory device 10 then performs a next operation (S460). When the RCC is not greater than the RCT (NO in S440), the nonvolatile memory device 10 may perform a next operation (S460) without applying the dummy pulse DP to at least some of the memory blocks BLK1~BLKz.

Figure 20:
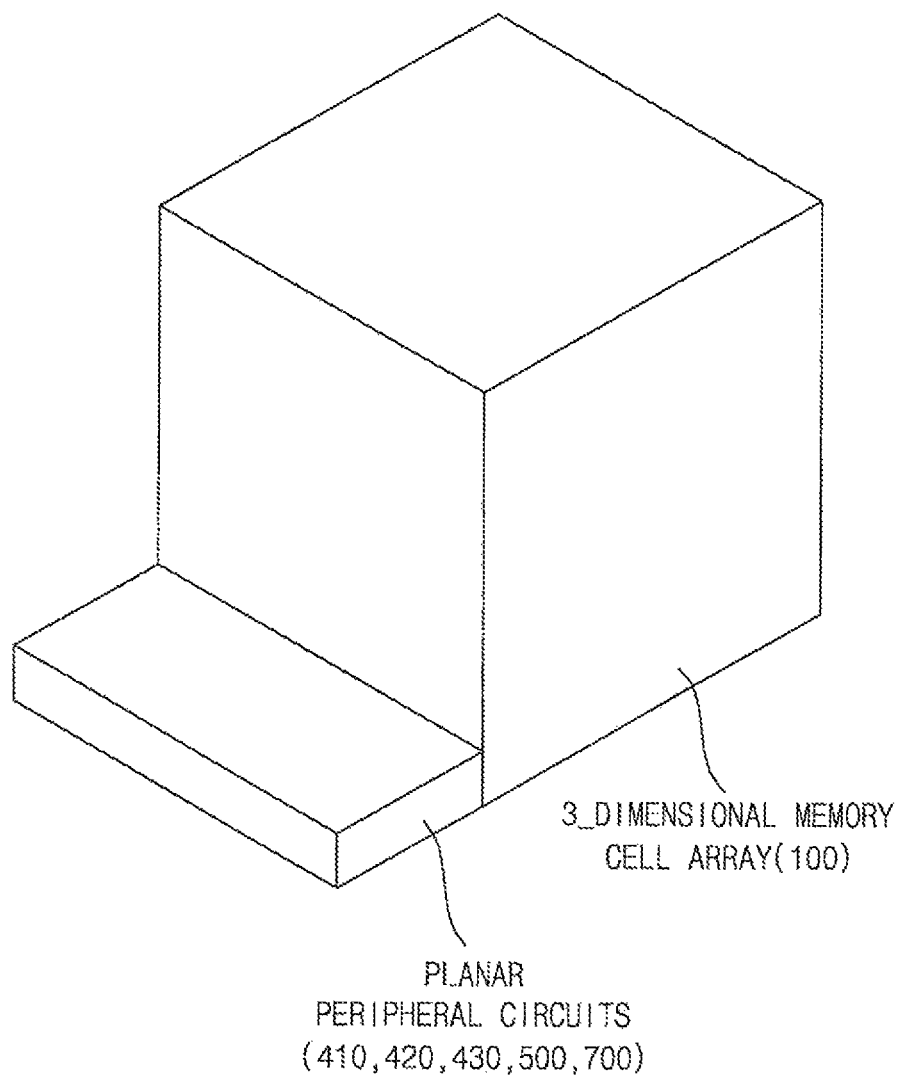
FIG. 20 is a perspective view illustrating a structure of the nonvolatile memory device described with reference to FIG. 1.

FIG. 20 is a perspective view illustrating a structure of the nonvolatile memory device described with reference to FIG. 1.

Referring to FIG. 20, the nonvolatile memory device 10 includes a three-dimensional memory cell array 100 and plane peripheral circuits 410, 420, 430, 500, and 700.

As described with reference to FIGS. 6 through 8, the memory cell array 100 includes memory cells stacked in a direction intersecting the substrate ill. That is, the memory cell array 100 has a three-dimensional structure in which memory cells are three-dimensionally arranged. The peripheral circuits 410, 420, 430, 500, and 600 include devices provided on the substrate 111 in a single layer. That is, the peripheral circuits 410, 420, 430, 500, and 700 include devices having a plane structure.

For example, it is illustrated that the peripheral circuits 410, 420, 430, 500, and 600 are provided at one side of the three-dimensional memory cell array 110. However, the position relationship of the peripheral circuits 410, 420, 430, 500, and 600 and their number are not limited.

For example, the peripheral circuits 410, 420, 430, 500, and 700 may be provided on at least two sides of the three-dimensional memory cell array 100. Additionally, at least two three-dimensional memory cell arrays 100 are provided and the plane peripheral circuits 410, 420, 430, 500, and 700 may be provided on at least one side of each of at least two three-dimensional memory cell arrays 100.

Figure 21:
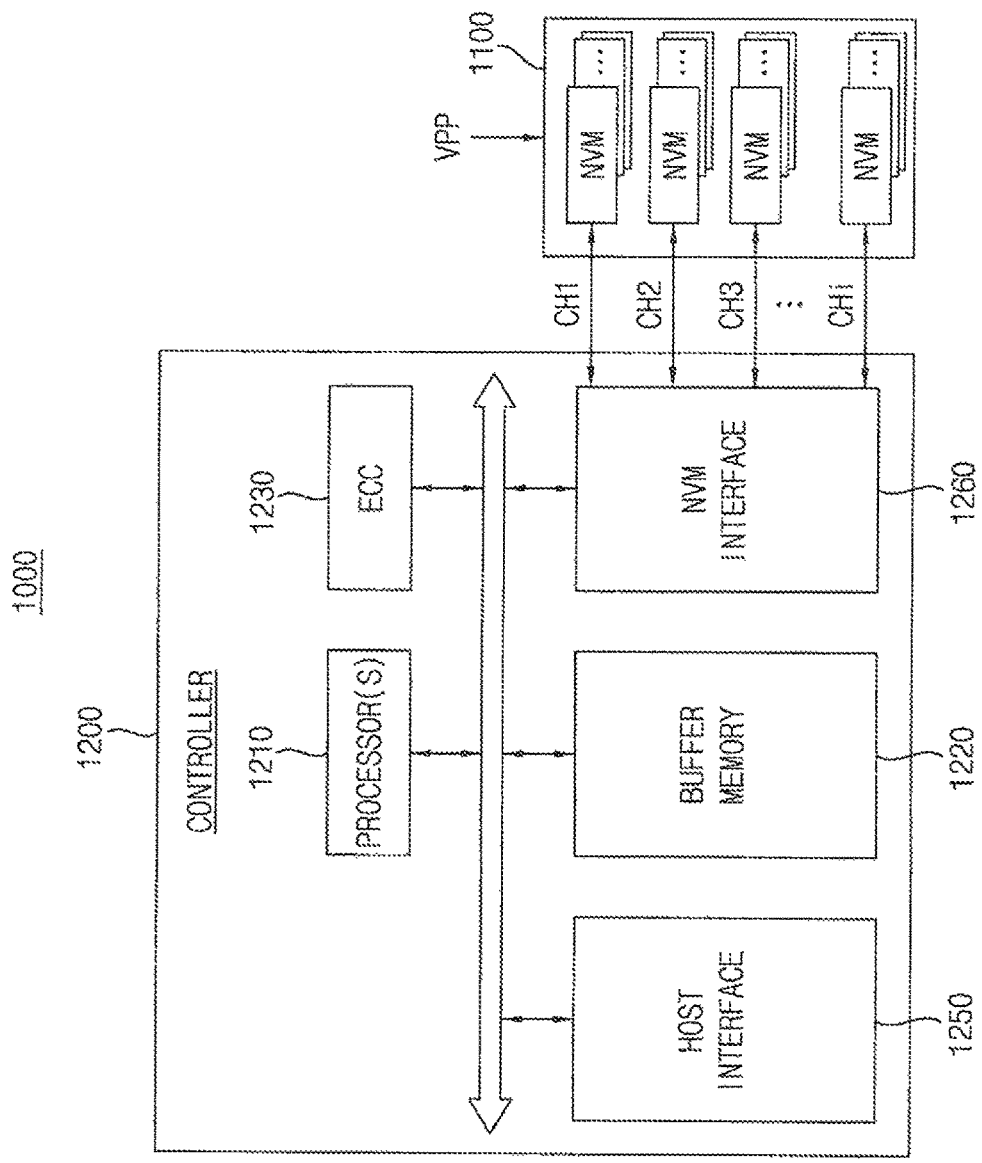
FIG. 21 is a block diagram illustrating a solid state disk or solid state drive (SSD) according to example embodiments.

FIG. 21 is a block diagram illustrating a solid state disk or solid state drive (SSD) according to example embodiments.

Referring to FIG. 21, SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may employ the nonvolatile memory device 10 of FIG. 1. Each of the nonvolatile memory devices 1100 may include a memory cell array having a plurality of memory blocks formed vertically with respect to a substrate, a control circuit and a voltage generator. The control circuit may include a dummy pulse controller. The dummy pulse controller performs a program loop on a plurality of pages of a first memory block of the memory blocks and controls the voltage generator such that the voltage generator applies a periodic dummy pulse to at least some of the memory blocks at least once before performing a read operation on a first page that is selected from the pages. Therefore, each of the nonvolatile memory devices 1100 may prevent the increase of a number of error bits in a read operation that is performed when an interval elapses from a completion of the program loop.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. Although FIG. 19 illustrates an embodiment where the buffer memory 1220 is included in the SSD controller 1200, the inventive concept is not limited thereto. Alternatively, for instance, the buffer memory 1220 may be placed outside the SSD controller 1200.

The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100. Although not shown in FIG. 19, a code memory may be further included to store code data needed to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

Figure 22:
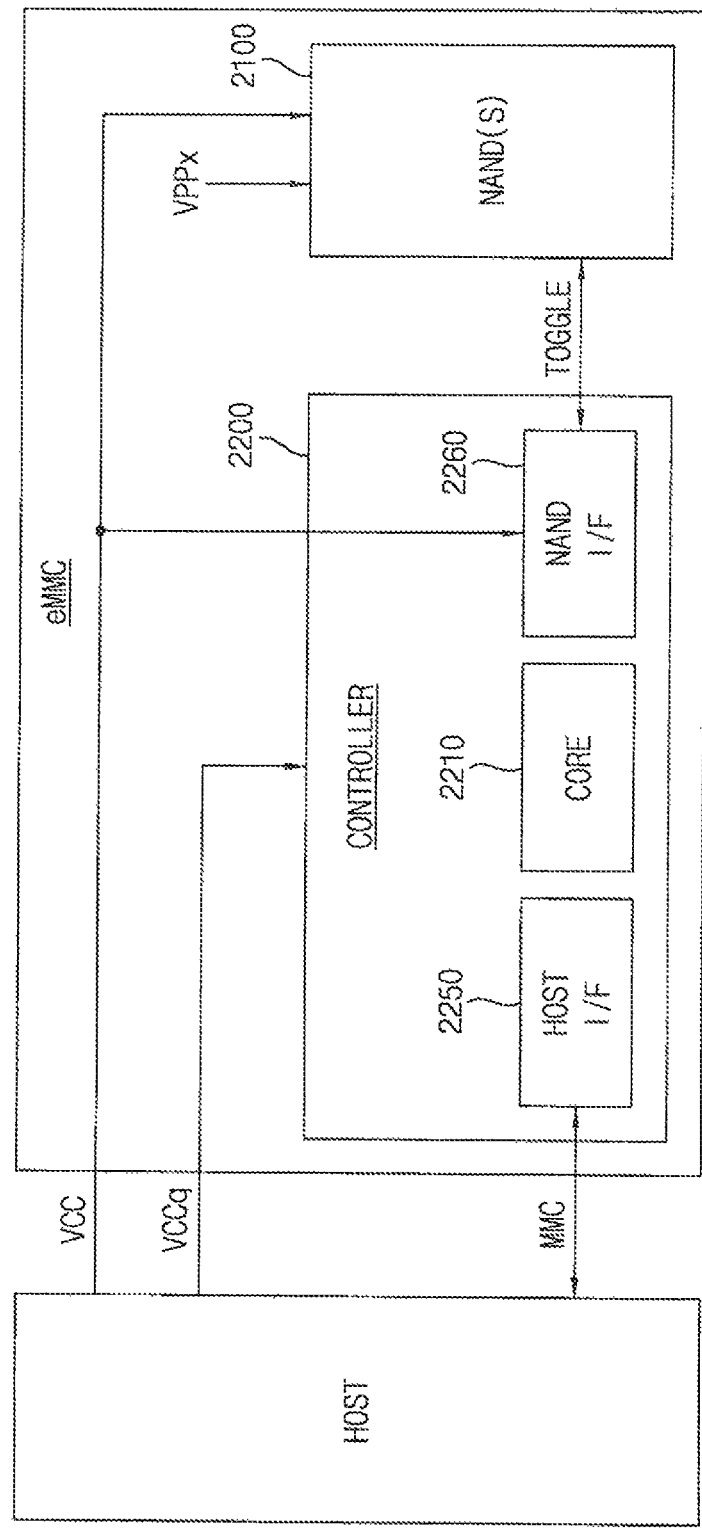
FIG. 22 is a block diagram illustrating an embedded multi-media card (eMMC) according to example embodiments.

FIG. 22 is a block diagram illustrating an embedded multi-media card (eMMC) according to example embodiments.

Referring to FIG. 22, an eMMC 2000 includes one or more NAND flash memory devices 2100 and a controller 2200.

The NAND flash memory device 2100 may employ the nonvolatile memory device 10 of FIG. 1. The NAND flash memory device 2100 may include a dummy pulse controller. The dummy pulse controller controls a voltage generator such that the voltage generator applies a periodic dummy pulse to at least some of memory blocks at least once before performing a read operation on a first page that is selected from pages. Therefore, the NAND flash memory device 2100 may prevent the increase of a number of error bits in a read operation that is performed when an interval elapses from a completion of the program loop.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The host interface 2250 is configured to perform an interface between the controller 2210 and a host. The NAND interface 2260 is configured to provide an interface between the NAND flash memory device 2100 and the controller 2200. In some example embodiments, the host interface 2250 may be a parallel interface (e.g., an MMC interface). In other example embodiments, the host interface 2250 of eMMC 2000 may be a serial interface (e.g., UFIS-II, UFS, etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In some embodiments, eMMC 2000 may be optionally supplied with an external high voltage VPPx.

Figure 23:
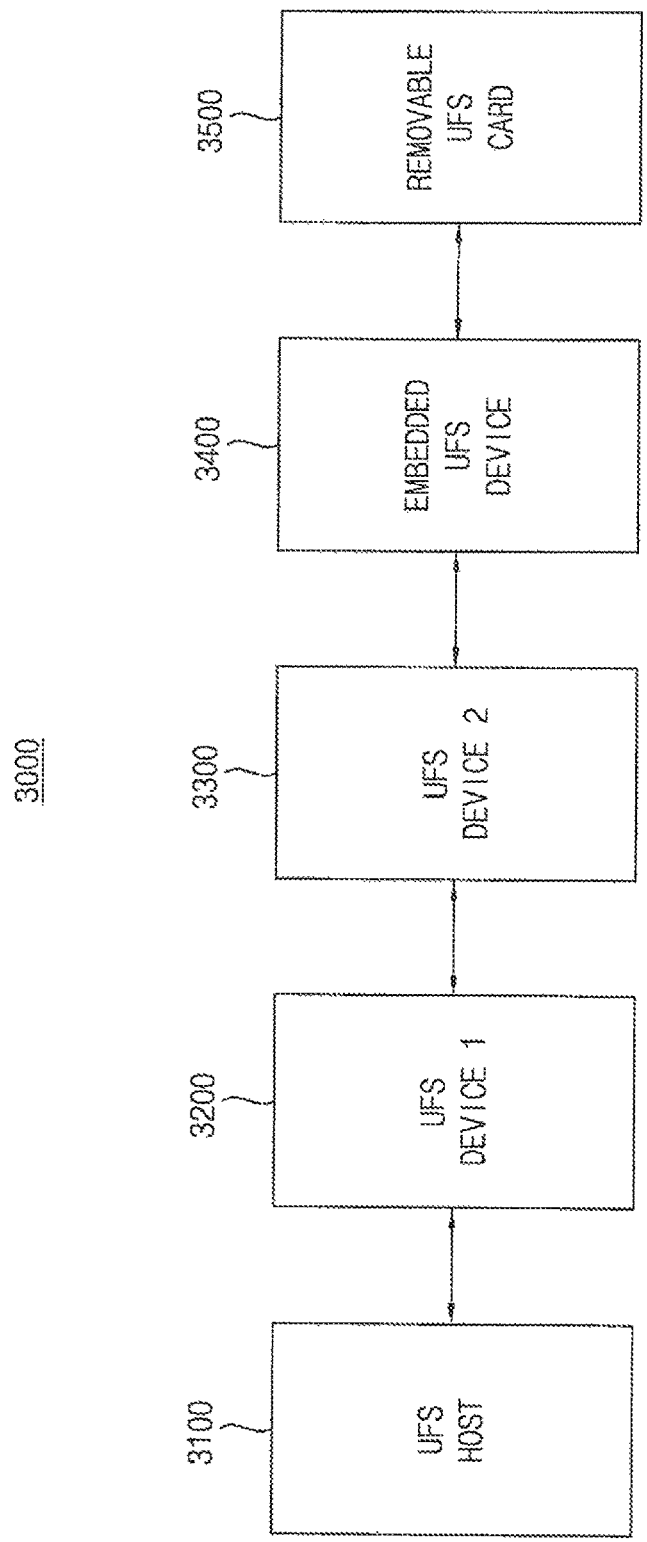
FIG. 23 is a block diagram illustrating a universal flash storage (UFS) according to example embodiments.

FIG. 23 is a block diagram illustrating a universal flash storage (UFS) according to example embodiments.

Referring to FIG. 23, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by the nonvolatile memory device 10 of FIG. 1. Therefore, at least one of the UFS devices 3200 and 3300, the embedded UFS device 3400, and the removable UFS card 3500 may prevent the increase of a number of error bits in a read operation by applying a periodic dummy pulse to at least some of memory blocks at least once before performing a read operation on a first page that is selected from pages.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Figure 24:
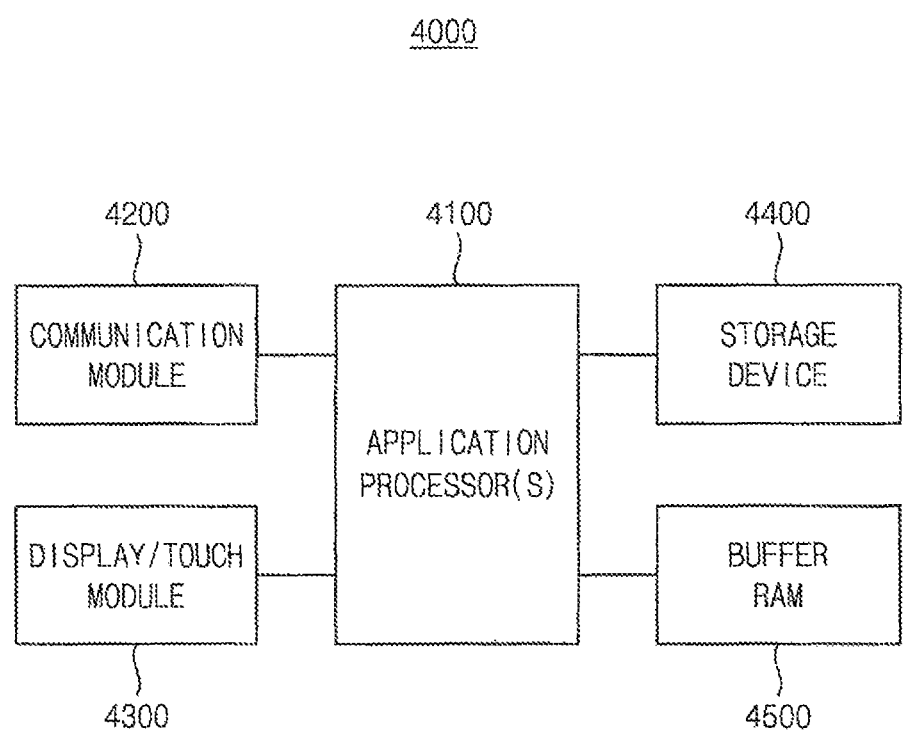
FIG. 24 is a block diagram illustrating a mobile device according to example embodiments.

FIG. 24 is a block diagram illustrating a mobile device according to example embodiments.

Referring to FIG. 24, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be eMMC, SSD, UFS device, etc. The storage device 4400 may employ the nonvolatile memory device of FIG. 1. The storage device 4400 may prevent the increase of a number of error bits in a read operation by applying a periodic dummy pulse to at least some of memory blocks at least once before performing a read operation on a first page that is selected from pages.

The mobile RAM 4500 temporarily stores data used for processing operations of the mobile device 4000.

It may be beneficial to implement a small-sized mobile device 4000 by improving the degree of freedom on lines to improve a layout.

A memory device or a storage device according to an embodiment of the inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

The present disclosure may be applied to various devices and systems. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a nonvolatile memory device, comprising:
    programming a plurality of pages of a first memory block of a plurality of memory blocks in a memory cell array in response to an address;
    after a completion of the programming, applying a dummy pulse to word-lines of a selected one of the plurality of memory blocks in response to a dummy pulse control signal, the dummy pulse control signal at least designating the word-lines; and
    after applying the dummy pulse, performing a read operation on a first page of the plurality of pages.

2. The method of claim 1, wherein the plurality of memory blocks are formed vertically with respect to a substrate.

3. The method of claim 2, further comprising:
    applying the dummy pulse to all of the plurality of memory blocks at least once in response to error bits occurring in read data at least a reference number of times after the read operation is performed.

4. The method of claim 1, wherein the dummy pulse is applied to a plurality of pages of the first memory block other than the first page.

5. The method of claim 1, wherein the dummy pulse is applied simultaneously to at least two pages of the first memory block.

6. The method of claim 5, wherein the dummy pulse is applied sequentially to at least two pages of the first memory block.

7. The method of claim 1, wherein the dummy pulse is applied to at least one page of the first memory block, wherein the at least one page is randomly selected from the plurality of pages of the first memory block.

8. The method of claim 1, wherein the dummy pulse is applied to all of the plurality of memory blocks when the nonvolatile memory device is powered-up.

9. The method of claim 1, wherein applying the dummy pulse comprises applying the dummy pulse to word-lines of the selected ones of the plurality of memory blocks without concurrently performing a read or write operation on the selected ones of the plurality of memory blocks.

10. The method of claim 1, wherein the dummy pulse is applied to all of the word-lines of the selected ones of the plurality of memory blocks.

11. The method of claim 1, wherein the dummy pulse is applied to at least some of the memory blocks based on a number of a program/erase cycles of the first memory block.

12. The method of claim 11, wherein an application interval of the dummy pulse decreases as the number of the program/erase cycles of the first memory block increases.

13. The method of claim 1, wherein the dummy pulse is applied to one of the plurality of memory blocks based on at least one of an elapsed time from a completion of the programming of the plurality of pages and an operating temperature of the nonvolatile memory device.

14. The method of claim 1, wherein the dummy pulse corresponds to one of a read pass voltage and a read voltage which are applied to word-lines of the nonvolatile memory device.

15. A nonvolatile memory device comprising:
    a memory cell array including a plurality of memory blocks;
    a voltage generator configured to generate word-line voltages in response to control signals;
    an address decoder configured to provide the word-line voltages to the memory cell array in response to an address signal; and
    a control circuit configured to control the voltage generator,
    wherein the control circuit is configured to sequentially program a plurality of pages of a first memory block of the plurality of memory blocks, and wherein the control circuit includes a dummy pulse controller configured to cause the voltage generator to apply a dummy pulse to word-lines of a selected one of the plurality of memory blocks after a completion of the programming and before a read operation is performed on a first one of the plurality of pages, the voltage generator configured to apply the dummy pulse to the word-lines in response to a dummy pulse control signal from the dummy pulse controller, the dummy pulse control signal at least designating the word-lines.

16. The nonvolatile memory device of claim 15, wherein the dummy pulse corresponds to one of a read pass voltage and a read voltage of the word-line voltages which are applied to word-lines of the nonvolatile memory device, and wherein the dummy pulse controller causes the voltage generator to apply the dummy pulse simultaneously to at least two memory blocks of the plurality of memory blocks.

17. The nonvolatile memory device of claim 15, wherein the dummy pulse controller causes the voltage generator to apply the dummy pulse to at least some of the memory blocks based on at least one of a number of a program/erase cycles of the first memory block, an elapsed time from a completion of programming of the plurality of pages of the first memory block, and an operating temperature of the nonvolatile memory device.

18. The nonvolatile memory device of claim 15, wherein the dummy pulse controller comprises:
    a first table that stores a number of program/erase cycles of at least one of the plurality of memory blocks and a maximum threshold value of an elapsed time from a completion of a programming loop associated with the program/erase cycles;

a second table that stores the number of the program/erase cycles and a maximum threshold value of a number of read retries associated with the program/erase cycles; and a dummy pulse control signal generator configured to generate a dummy pulse control signal that causes the voltage generator to apply the dummy pulse in response to at least one of a first counting value, a second counting value, a time information, a temperature signal, a mode signal and a power-up signal, wherein the first counting value indicates the number of program/erase cycles, the second counting value indicates the number of the read retries, the time information indicates the elapsed time from the completion of the programming loop, the temperature signal indicates an operating temperature of the nonvolatile memory device, and the mode signal indicates an operation mode of the nonvolatile memory device.

19. A solid-state drive (SSD) comprising:

a plurality of nonvolatile memory devices; and an SSD controller configured to control the plurality of nonvolatile memory devices, wherein each of the plurality of nonvolatile memory devices comprises:

a memory cell array including a plurality of memory blocks that are formed vertically with respect to a substrate;

a voltage generator configured to generate word-line voltages based on control signals;

an address decoder configured to provide the word-line voltages to the memory cell array based on an address signal; and a control circuit configured to control the voltage generator, wherein the control circuit is configured to sequentially perform a program loop on a plurality of pages of a first memory block of the plurality of memory blocks and the control circuit includes a dummy pulse controller configured to cause the voltage generator to apply a dummy pulse to at least some of the plurality of memory blocks at least once after the completion of the program loop and before a read operation is performed on a first page that is selected among the plurality of pages, the voltage generator configured to apply the dummy pulse to the word-lines in response to a dummy pulse control signal from the dummy pulse controller, the dummy pulse control signal at least designating the word-lines.

20. The SSD of claim 19, wherein:

the SSD controller is configured to perform an error correction code (ECC) decoding on a read data from each of the plurality of nonvolatile memory devices and configured to provide each of the plurality of nonvolatile memory devices with a corresponding pass/fail information of the read data; and the dummy pulse controller is configured to causer the voltage generator to apply the dummy pulse to all of the memory blocks at least once in response to the pass/fail information indicating that error bits in the read data occur consecutively at least a reference number of times following the program loop.

* * * * *